US008692230B2

(12) United States Patent
Zhou et al.

(10) Patent No.: US 8,692,230 B2
(45) Date of Patent: Apr. 8, 2014

(54) HIGH PERFORMANCE FIELD-EFFECT TRANSISTORS

(75) Inventors: Chongwu Zhou, Arcadia, CA (US); Alexander Badmaev, Hillsboro, OR (US); Chuan Wang, Albany, CA (US); Yuchi Che, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 42 days.

(21) Appl. No.: 13/430,457

(22) Filed: Mar. 26, 2012

(65) Prior Publication Data

US 2012/0248416 A1 Oct. 4, 2012

Related U.S. Application Data

(60) Provisional application No. 61/468,993, filed on Mar. 29, 2011.

(51) Int. Cl.
*H01L 29/06* (2006.01)
*H01L 29/08* (2006.01)

(52) U.S. Cl.
USPC .......................................................... 257/29

(58) Field of Classification Search
CPC ............ H01L 29/1606; H01L 21/3144; H01L 21/3185
USPC .................. 257/213–413, 900, 902–903, 29, 257/E21.19–E21.21, E21.394–E21.458, 257/E21.615–E21.694, 574, 587–588, 592, 257/595, 652, E29.049–E21.43, E21.618, 257/E21.634, E29.116–E29.122, E29.284, 257/E29.299
See application file for complete search history.

(56) References Cited

U.S. PATENT DOCUMENTS

| 5,559,349 | A  | 9/1996  | Cricchi et al.  |
|-----------|----|---------|-----------------|
| 6,333,016 | B1 | 12/2001 | Resasco et al.  |
| 6,361,861 | B2 | 3/2002  | Gao et al.      |
| 6,440,761 | B1 | 8/2002  | Choi            |
| 6,646,598 | B1 | 11/2003 | Timothy et al.  |

(Continued)

FOREIGN PATENT DOCUMENTS

WO   WO2011137404 A2   11/2011
WO   WO2012135380 A2   10/2012

OTHER PUBLICATIONS

Avouris et al; Carbon-based electronics; Nature Nanotechnology; 2007; pp. 2:605-2:615.

(Continued)

*Primary Examiner* — Dao H Nguyen
*Assistant Examiner* — Tram H Nguyen
(74) *Attorney, Agent, or Firm* — Fish & Richardson P.C.

(57) ABSTRACT

A high performance field-effect transistor includes a substrate, a nanomaterial thin film disposed on the substrate, a source electrode and a drain electrode formed on the nanomaterial thin film, and a channel area defined between the source electrode and the drain electrode. A unitary self-aligned gate electrode extends from the nanomaterial thin film in the channel area between the source electrode and the drain electrode, the gate electrode having an outer dielectric layer and including a foot region and a head region, the foot region in contact with a portion of the nanomaterial thin film in the channel area. A metal layer is disposed over the source electrode, the drain electrode, the head region of the gate electrode, and portions of the nanomaterial thin film proximate the source electrode and the drain electrode in the channel area.

25 Claims, 13 Drawing Sheets

(56) References Cited

U.S. PATENT DOCUMENTS

| | | | |
|---|---|---|---|
| 6,756,026 | B2 | 6/2004 | Colbert et al. |
| 6,882,051 | B2 | 4/2005 | Majumdar et al. |
| 7,160,532 | B2 | 1/2007 | Liu et al. |
| 7,288,321 | B2 | 10/2007 | Liu et al. |
| 7,338,554 | B2 | 3/2008 | Delaunay et al. |
| 7,368,791 | B2 * | 5/2008 | Zhang et al. .................. 257/401 |
| 7,394,118 | B2 | 7/2008 | Zhou |
| 7,419,651 | B2 | 9/2008 | Smalley et al. |
| 7,438,844 | B2 | 10/2008 | Huang et al. |
| 7,511,206 | B2 | 3/2009 | Hiraoka et al. |
| 7,576,971 | B2 | 8/2009 | Lipka et al. |
| 7,662,652 | B2 | 2/2010 | Zhou |
| 7,687,876 | B2 | 3/2010 | Kabir |
| 7,714,386 | B2 * | 5/2010 | Pesetski et al. ............... 257/347 |
| 7,776,764 | B2 | 8/2010 | Cho et al. |
| 7,834,530 | B2 | 11/2010 | Manohara et al. |
| 7,858,454 | B2 * | 12/2010 | Kalburge ...................... 438/151 |
| 8,063,451 | B2 * | 11/2011 | Zhang et al. .................. 257/401 |
| 8,066,842 | B2 | 11/2011 | Farmer et al. |
| 8,106,430 | B2 | 1/2012 | Cho et al. |
| 8,187,746 | B2 | 5/2012 | Chen et al. |
| 8,324,087 | B2 | 12/2012 | Zhou et al. |
| 8,354,291 | B2 | 1/2013 | Zhou et al. |
| 2002/0130311 | A1 | 9/2002 | Lieber et al. |
| 2003/0107065 | A1 | 6/2003 | Taniguchi et al. |
| 2004/0018371 | A1 | 1/2004 | Mao |
| 2004/0036128 | A1 * | 2/2004 | Zhang et al. .................. 257/401 |
| 2004/0043219 | A1 | 3/2004 | Ito et al. |
| 2004/0240156 | A1 | 12/2004 | Norton et al. |
| 2005/0189883 | A1 | 9/2005 | Suh et al. |
| 2006/0113510 | A1 | 6/2006 | Luo et al. |
| 2007/0281409 | A1 * | 12/2007 | Zhang et al. .................. 438/197 |
| 2008/0008844 | A1 | 1/2008 | Bettge et al. |
| 2008/0158778 | A1 | 7/2008 | Lipka et al. |
| 2008/0173864 | A1 * | 7/2008 | Fujita et al. ...................... 257/40 |
| 2008/0182369 | A1 | 7/2008 | Jeong et al. |
| 2008/0247118 | A1 | 10/2008 | Long et al. |
| 2008/0261342 | A1 | 10/2008 | Zhou |
| 2008/0292840 | A1 | 11/2008 | Majumdar et al. |
| 2009/0045061 | A1 | 2/2009 | Farrow et al. |
| 2009/0061315 | A1 | 3/2009 | Nakano et al. |
| 2009/0085063 | A1 | 4/2009 | Makiyama et al. |
| 2009/0101962 | A1 * | 4/2009 | Hong et al. .................. 257/322 |
| 2009/0146208 | A1 * | 6/2009 | Ban et al. ..................... 257/326 |
| 2009/0166686 | A1 * | 7/2009 | Hunt et al. .................... 257/288 |
| 2009/0224230 | A1 * | 9/2009 | Pesetski et al. ................ 257/24 |
| 2009/0278111 | A1 | 11/2009 | Pop |
| 2010/0001255 | A1 | 1/2010 | Bao et al. |
| 2010/0065818 | A1 | 3/2010 | Kim et al. |
| 2010/0127242 | A1 | 5/2010 | Zhou et al. |
| 2010/0133511 | A1 | 6/2010 | Zhou et al. |
| 2010/0140665 | A1 | 6/2010 | Singbal et al. |
| 2010/0173462 | A1 | 7/2010 | Appenzeller et al. |
| 2010/0295097 | A1 | 11/2010 | Takenaka et al. |
| 2011/0073837 | A1 | 3/2011 | Zhou et al. |
| 2011/0101302 | A1 | 5/2011 | Zhou et al. |
| 2011/0229777 | A1 | 9/2011 | Mak et al. |
| 2011/0235240 | A1 | 9/2011 | Lu et al. |
| 2011/0262772 | A1 | 10/2011 | Hauge et al. |
| 2011/0269967 | A1 | 11/2011 | Shukla et al. |
| 2011/0277813 | A1 | 11/2011 | Rogers et al. |
| 2011/0304953 | A1 | 12/2011 | Zhou et al. |
| 2011/0304955 | A1 | 12/2011 | Zhou et al. |
| 2012/0012817 | A1 * | 1/2012 | Hong et al. ..................... 257/29 |
| 2012/0138902 | A1 * | 6/2012 | Hunt et al. ...................... 257/29 |
| 2012/0261646 | A1 | 10/2012 | Zhou et al. |
| 2013/0119348 | A1 | 5/2013 | Zhou et al. |

OTHER PUBLICATIONS

Avouris; Graphene: Electronic and Photonic Properties and Devices; Nano Letters; 2010; pp. 10:4285-10:4294.

Bae et al; Roll-to-roll production of 30-inch graphene films for transparent electrodes; Nature Nanotechnology; 2010; pp. 5:574-5:578.

Dimitrakopoulos et al; Wafer-scale epitaxial graphene growth on the Si-face of hexagonal SiC (0001) for high frequency transistors; Journal of Vacuum Science & Technology B; 2010; pp. 28:985-28:992.

Ding et al; Self-aligned U-gate carbon nanotube field-effect transistor with extremely small parasitic capacitance and drain-induced barrier lowering; ACS Nano; 2011; pp. 5:2512-5:2519.

Geim et al; The rise of graphene; Nature Material; 2007; pp. 6:183-6:191.

Han et al; High-frequency graphene voltage amplifier; Nano Letter; 2011; pp. 11:3690-11:3693.

Javey et al; Self-Aligned Ballistic Molecular Transistors and Electrically Parallel Nanotube Arrays; Nano Letters; 2004; pp. 4:1319-4:1322.

Kim et al; Realization of a high mobility dual-gated graphene field-effect transistor with Al2O3 dielectric; Appl. Phys. Lett. ; 2009.

Li et al; Large-Area Synthesis of High-Quality and Uniform Graphene Films on Copper Foils; Science; 2009; pp. 324:1312-324:1314.

Li et al; Low operating bias and matched input-output characteristics in graphene logic inverters; Nano Letters; 2010; pp. 10:2357-10:2362.

Liao et al; High-speed graphene transistors with a self-aligned nanowire gate; Nature; 2010; pp. 467:305-467:308.

Liao et al; Sub-100 nm channel length graphene transistors; Nano Letters; 2010; pp. 10:3952-10:3956.

Lin et al; 100-GHz Transistors from Wafer-Scale Epitaxial Graphene; Science; 2010; pp. 327:662.

Lin et al; Wafer-Scale Graphene Integrated Circuit; Science; 2011; pp. 332:1294-332:1297.

Meric et al; Channel length scaling in graphene field-effect transistors studied with pulsed current-voltage measurements; Nano Letters; 2011; pp. 11:1093-11:1097.

Meric et al; Current saturation in zero-bandgap, top-gated graphene field-effect transistors; Nature Nanotechnology; 2008; pp. 3:654-3:659.

Moon et al; Low-Phase-Noise Graphene FETs in Ambipolar RF Applications; IEEE Electron Device Letters; 2011; pp. 32(3):270-32(3):272.

Moon et al; Top-Gated Epitaxial Graphene FETs on Si-Face SiC Wafers With a Peak Transconductance of 600 mS/mm; IEEE Electron Device Letters; 2010; pp. 31(4):260-31(4):262.

Neto et al; The electronic properties of graphene; Reviews of Modern Physics; 2009; pp. 81:109-81:162.

Ryu et al; CMOS-Analogous Wafer-Scale Nanotube-on-Insulator Approach for Submicrometer Devices and Integrated Circuits Using Aligned Nanotubes; Nano Letters; 2009; pp. 9:189-9:197.

Schwierz; Graphene transistors; Nature Nanotechnology; 2010; pp. 5:487-5:496.

Wang et al; A high-performance top-gate graphene field-effect transistor based frequency doubler; Appl. Phys. Lett ; 2010; pp. 96:173104.

Wang et al; BN/Graphene/BN Transistors for RF Applications; IEEE Electron Device Letters; 2009; pp. 30:547-30:549.

Wang et al; Graphene-Based Ambipolar RF Mixers; IEEE Electron Device Letters; 2010; pp. 31:906-31:908.

Wang et al; Wafer-Scale Fabrication of Separated Carbon Nanotube Thin-Film Transistors for Display Applications; Nano Letters; 2009; pp. 9:4285-9:4291.

Wu et al; High-frequency, scaled graphene transistors on diamond-like carbon; Nature; 2011; pp. 472:74-472:78.

Xu et al; Quantum Capactiance Limited Vertical Scaling of Graphene Field-Effect Transistor; ACS nano; 2011; pp. 5:2340-5:2347.

Yang et al; Triple-mode single-transistor graphene amplifier and its applications; ACS Nano; 2010; pp. 4:5532-4:5538.

Zhang et al; Comparison of Graphene Growth on Single-Crystalline and Polycrystalline Ni by Chemical Vapor Deposition; Journal of Physical Chemistry Letters; 2010; pp. 1:3101-1:3107.

Zhang et al; Self-Aligned Ballistic n-Type Single-Walled Carbon Nanotube Field-Effect Transistors with Adjustable Threshold Voltage; Nano Letters; 2008; pp. 8:3696-8:3701.

Ago et al., "Aligned growth of isolated single-walled carbon nanotubes programmed by atomic arrangement of substrate surface," *Chemical Physics Letters*, 408(4-6):433-438, May 2005.

(56) References Cited

OTHER PUBLICATIONS

Arnold et al., "Enrichment of Single-Walled Carbon Nanotubes by Diameter in Density Gradients," *Nano Lett.* 5(4):713-718, 6 pages, Mar. 2005.
Arnold et al., "Sorting Carbon Nanotubes by Electronic Structure Using Density Differentiation," *Nat. Nanotechnol.*, 1:60-65, Oct. 2006.
Artukovic et al., "Transparent and Flexible Carbon Nanotube Transistors," 2005, *Nano Lett.* 5(4):757-760, 4 pages.
Avouris et al., "Carbon nanotubes: nanomechanics, manipulation, and electronic devices," 1999, *Applied Surface Science* 141(304):201-209, 9 pages.
Avouris et al., "Carbon-Based Electronics," Oct. 2007, *Nature Nanotechnology*, 2:605-615, 11 pages.
Bachilo et al., "Narrow (n,m)-Distribution of Single-Walled Carbon Nanotubes Grown Using a Solid Supported Catalyst," 2003, *Journal of the American Chemical Society*,125(37):11186-11187.
Bachtold et al., Logic circuits with carbon nanotube transistors, *Science*, 294:1317-1320 Nov. 2001.
Bohr, "Nanotechnology Goals and Challenges for Electronic Applications," Mar. 2002, *IEEE Transactions on Nanotechnology*, 1(1):56-62.
Buffa et al., "Side-Wall Functionalization of Single-Walled Carbon Nanotubes with 4-Hydroxymethylaniline Followed by Polymerization of—Caprolactone,"2005, *Macromolecules*, 38, 8258-8263, 6 pages.
Burke, "AC performance of nanoelectronics: towards a ballistic THz nanotube transistor," *Solid-State Electronics*, 48(10-11): 1981-1986, Oct.-Nov. 2004.
Cao et al., "Gate Capacitance Coupling of Singled-Walled Carbon Nanotube Thin Film Transistors," 2007, *Appl. Phys. Lett.*, vol. 90, 023516-1-023516-3, 4 pages.
Cao et al., "Medium-scale carbon nanotube thin-film integrated circuits on flexible plastic substrates," *Nature*, 454: 495-502, Jul. 2008.
Cao et al., "Ultrathin Films of Single-Walled Carbon Nanotubes for Electronics and Sensors: A Review of Fundamental and Applied Aspects," *Advanced Materials*, 2009, 21, 29-53, 25 pages.
Chan et al., "Oxidation of Carbon Nanotubes by Singlet O2," Feb. 28, 2003, *Physical Review Letters*, 90(8):86403-1-4 (2003), 4 pages.
Chaste et al., "Single carbon nanotube transistor at GHz frequency," *Nano Lett.*, 8(2):525-528, Jan. 2008.
Chattopadhyay et al., "A Route for Bulk Separation of Semiconducting from Metallic Single-Wall Carbon Nanotubes," 2003, *J. Am. Chem. Soc.*, 125, 3370-3375, 6 pages.
Chen et al., "Flexible and transparent supercapacitor based on In2O3 nanowire/carbon nanotube heterogeneous films," *Applied Physics Letters* 94(4), 043113 http://dx.doi.org/10.1063/1.3069277, 3 pages, Jan. 2009.
Chen et al., "An Integrated Logic Circuit Assembled on a Single Carbon Nanotube," *Science*, 311:1735, Mar. 2006.
Chen et al., "Bulk Separative Enrichment in Metallic or Semiconducting Single-Walled Carbon Nanotubes," 2003, *Nano Letters*, 3(9):1245-1249, 5 pages.
Chen et al., "Chemically Doped Double-Walled Carbon Nanotubes: Cylindrical Molecular Capacitors," Jun. 27, 2003, *Physical Review Letters*, 90(25):257403-1-257403-1, 4 pages.
Chen et al., "Novel Method of Converting Metallic-Type Carbon Nanotubes to Semiconducting-Type Carbon Nanotube FIeld-Effect Transistors," 2006, *Japanese Journal of Applied Physics* 45(4B):3680-3685, 6 pages.
Chen et al., "Toward the Extraction of Single Species of Single-Walled Carbon Nanotubes Using Fluorene-Based Polymers," 2007, *Nano Letters* 7, 3013, 5 pages.
Collins et al., "Engineering carbon nanotubes and nanotube circuits using electrical breakdown," *Science*, 292:706-709 (Apr. 2001).
Derycke et al., "Carbon Nanotube Inter- and Intramolecular Logic Gates," *Nano Lett.*, 1(9):453-456, Sep. 2001.
Derycke et al., "Controlling doping and carrier injection in cabon nanotube transistors," *Appl. Phys. Lett.*, 80:2773-2775 (2002).

Dimitrakopoulos et al., "Organic Thin-Film Transistors: A Review of Recent Advances," 2001, *IBM J. Res. Dev.*, 45, 11-27, 17 pages.
Durkop et al., "Extraordinary Mobility in Semiconducting Carbon Nanotubes," *Nano Lett.*, 4(1):35-39, Dec. 2003 online, print 2004.
Engel et al., "Thin Film Nanotube Transistors Based on Self-Assembled, Aligned, Semiconducting Carbon Nanotube Arrays," *ACS Nano*, 2(12):2445-2452, Dec. 2008.
Forrest, S. R., "The Path to Ubiquitous and Low-Cost Organic Electronic Appliances on Plastic," 2004, *Nature*, 428, 911-918, 8 pages.
Gelinck et al., "Flexible Active-Matrix Displays and Shift Registers Based on Solution-Processed Organic transistors," 2004, *Nat. Mater.*, 3, 106-110, 5 pages.
Gomez et al., "Scalable light-induced metal to semiconductor conversion of carbon nanotubes," *Nano Lett.*, 9(10):3592-3598, Sep. 2009.
Gomez-De Arco et al., "Resonant micro-Raman spectroscopy of aligned single-walled carbon nanotubes on a-plane sapphire," 2008, *Applied Physics Letters* 93:123112.1-3, 3 pages.
Han et al., "Template-free directional growth of single-walled carbon nanotubes on a- and r-plane sapphire," *J. Am. Chem. Soc.*, 127:5294-5295 (2005).
Heaney and Veblen, "Observations of the alpha-beta phase transition in quartz: A review of imaging and diffraction studies and some new results," *American Mineralogist*, 76:1018-1032, 1991.
Hu et al., "Percolation in Transparent and Conducting Carbon Nanotube Networks ," 2004, *Nano Lett.*, 4, 2513-2517, 5 pages.
Huang et al., "Preferential Destruction of Metallic Single-Walled Carbon Nanotubes by Laser Irradiation," 2006, *J. Phys. Chem. B*, 110(14):7316-7320, 5 pages.
Ishikawa et al., "Transparent Electronics Based on Transfer Printed Aligned Carbon Nanotubes on Rigid and Flexible Substrates ," 2008, *ACS Nano*, 3, 73-79, 7 pages.
Ismach et al., "Atomic-step-templated formation of single wall carbon nanotube patterns," *Angew Chem. Int. Ed.*, 43:6140-6143 (2004).
Javey et al, "Carbon Nanotube Transistor Arrays for Multistage Complementary Logic and Ring Oscillators," *Nano Lett.*, 2(9):929-932, Jul. 2002.
Javey et al., "Ballistic carbon nanotube field-effect transistors," *Nature*, 424: 654-657, Aug. 2003.
Javey et al., "Carbon Nanotube Field-Effect Transistors with Integrated Ohmic Contacts and High-κ Gate Dielectrics," *Nano Lett.*, 4, 447-450, Feb. 2004.
Joselevich and Lieber, "Vectorial Growth of Metallic and Semiconducting Single-Wall Carbon Nanotubes," 2002, *Nano Letters*, 2(10):1137-1141, 5 pages.
Ju et al., "37.3: High Performance 2.2" QCIF Full Color AMOLED Display based on Electrophosphorescence," *SID Symposium Digest of Technical Papers*, 33(1):1096-1099, May 2002.
Kang et al., "High-Performance Electronics Using Dense, Perfectly Aligned Arrays of Single-Walled Carbon Nanotubes," *Nature Nanotech.*, 2: 230-236, Mar. 2007 online, Apr. 2007 print.
Kim et al., "Raman and IR Spectroscopy of Chemically Processed Single-Walled Carbon Nanotubes," 2005, *Journal of the American Chemical Society*, 127, 15437-15445, 9 pages.
Kim et al., "Realization of a high mobility dual-gated graphene field-effect transistor with Al2O3 dielectric," *Appl. Phys. Lett*, 2009, 94, 062107.
Klauk et al., "Flexible Organic Complementary Circuits," 2005, *IEEE Trans. Electron Devices*, 52, 618-622, 5 pages.
Klinke et al., "Charge transfer induced polarity switching in carbon nanotube transistors," *Nano Lett.*, 5:555-558 (2005).
Kocabas et al., "High-Frequency Performance of Submicrometer Transistors That Use Aligned Arrays of Single-Walled Carbon Nanotubes," *Nano Lett.*, 9(5): 1937-1943, Apr. 2009.
Kocabas et al., "Guided Growth of Large-Scale, Horizontally Aligned Arrays of Single-Walled Carbon Nanotubes and Their Use in Thin-Film Transistors," *Small*, 1:1110-1116 (2005).
Kocabas et al., "Radio Frequency Analog Electronics Based on Carbon Nanotube Transistors," *Proc. Natl. Acad. Sci. U.S.A.*, 105(5): 1405-1409, Feb. 2008.

(56) References Cited

OTHER PUBLICATIONS

Kocabas et al., "Experimental and Theoretical Studies of Transport through Large Scale, Partially Aligned Arrays of Single-Walled Carbon Nanotubes in Thin Film Type Transistors," *Nano Lett.*, 7(5):1195-1202, 2007.
Kong et al., "Alkaline metal-doped n-type semiconducting nanotubes as quantum dots," *Appl. Phys. Lett.*, 77:3977-3979 (2000).
Krupke et al., "Separation of Metallic from Semiconducting Single-Walled Carbon Nanotubes," *Science* 301(5631):344-347, online Jun. 2003, print Jul. 2003.
LeMieux et al., "Self-Sorted, Aligned Nanotube Networks for Thin-Film Transistors ," Jul. 2008, *Science*, 321,101-104, 5 pages.
Li et al., "Carbon Nanotube Transistor Operation at 2.6 GHz," *Nano Lett.*, 4(4): 753-756, Mar. 2004.
Li et al., "Preferential Growth of Semiconducting Single-Walled Carbon Nanotubes by a Plasma Enhanced CVD Method," 2004, *Nano Letters* 4(2):317-321, 5 pages.
Lin et al., "High-Performance Carbon Nanotube Field-Effect Transistor With Tunable Polarities," *IEEE Transactions on Nanotechnology*, 4:481-489 (2005).
Liu et al., "Novel nanotube-on-insulator (NOI) approach toward single-walled carbon nanotube devices," *Nano Lett.*, 6(1): 34-39, published online Dec. 2005, print 2006.
Liu et al., "Carbon nanotube field-effect inverters," *Appl. Phys. Lett.*, 79(20): 3329-3331, Nov. 2001.
Louarn et al., "Intrinsic current gain cutoff frequency of 30GHz with carbon nanotube transistors," *Appl. Phys. Lett.*, 90(23): 233108-1-233108-3, Jun. 2007.
Mahar et al., "Development of Carbon Nanotube-Based Sensors—A Review," 2007, *IEEE Sensors Journal*, 7(2):266-284, 19 pages.
Nish et al., "Highly selective dispersion of single-walled carbon nanotubes using aromatic polymers," 2007, *Nature Nanotechnology* 2:640-646, 7 pages.
Nougaret et al., "80 GHz Field-Effect Transistors Produced Using High Purity Semiconducting Single-Walled Carbon Nanotubes," *Appl. Phys. Lett.*, 94, 243505-1-243505-3, Jun. 2009.
Park et al., "Adsorption of Atomic Hydrogen on Single-Walled Carbon Nanotubes," 2005, *Journal of Physical Chemistry B* 109, 8967-8972, 6 pages.
Park et al., "Generalized Chemical Reactivity of Curved Surfaces: Carbon Nanotubes," 2003, *Nano Letters* 3, 1273, 5 pages.
Pesetski et al., "Carbon Nanotube Field-Effect Transistor Operation at Microwave Frequencies," *Appl. Phys. Lett.* 88: 113103-1-113103-3, Mar. 2006.
Pimparkar et al., "Current-Voltage Characteristics of Long-Channel Nanobundle Thin-Film Transistors: A "Bottom-Up" Perspective ," 2007, *Electron Device Lett.*, 28, 157-160, 4 pages.
Pimparkar et al., "Limits of Performance Gain of Aligned CNT Over Randomized Network: Theoretical Predictions and Experimental Validation ," 2007, *Electron Device Lett.*, 28, 593-595, 3 pages.
Seo et al., "Chirality- and Diameter-Dependent Reactivity of NO2 on Carbon Nanotube Walls," 2005, *Journal of the American Chemical Society*, 127, 15724-15729, 6 pages.
Shim et al., "Polymer functionalization for air-stable n-type carbon nanotube field-effect transistors," *J. Am. Chem. Soc.*, 123:11512-11513 (2001).
Sneli et al., "Application of Amorphous Silicon Field Effect Transistors in Addressable Liquid Crystal Display Panels," 1981, *Appl. Phys. Lett.*, 24, 357-362, 6 pages.
Snow et al., "High-Mobility Carbon-Nanotube Thin-Film Transistors on a Polymeric Substrate ," 2005, *Appl. Phys. Lett.*, 86, 033105-1-033105-3, 3 pages.
Snow et al., "Random Networks of Carbon Nanotubes as an Electronic Material ," Mar. 2003, *Appl. Phys. Lett.*, 82, 145-2147, 3 pages.
Tedetti et al., "Hydroxyl radical-induced photochemical formation of dicarboxylic acids from unsaturated fatty acid (oleic acid) in aqueous solution," 2007, *Journal of Photochemistry and Photobiology A*, 188:135-139, 5 pages.

Thostenson et al., "Advances in the Science and Technology of Carbon Nanotubes and Their Composites: A Review," 2001, *Composites Science and Technology* 61:1899-1912, 14 pages.
Uchikoga, S., "Low-Temperature Polycrystalline Silicon Thin-Film Transistor Technologies for System-on-Glass Displays ," 2002, *MRS Bull.*, 27, 881-886, 6 pages.
Vijayaraghavan et al., "Metal-Semiconductor Transition in Single-Walled Carbon Nanotubes Induced by Low-Energy Electron Irradiation," 2005, *Nano Letters* 5(8):1575-1579, 5 pages.
Wang et al., "Analog/RF Performance of Si Nanowire MOSFETs and the Impact of Process Variation," *IEEE Trans. Electron Devices*, 54(6): 1288-1294, Jun. 2007.
Wang et al., "Device study, chemical doping, and logic circuits based on transferred aligned single-walled carbon nanotubes," *Appl. Phys. Lett.*, 93:033101-1-033101-3, Jul. 2008.
Wang et al., "Macroelectronic integrated circuits using high-performance separated carbon nanotube thin-film transistors," *ACS Nano.*, 4(12):7123-7132, Nov. 2010 online, Dec. 2010 print.
Wang et al., "Radio frequency and linearity performance of transistors using high-purity semiconducting carbon nanotubes," *ACS Nano.*, 5(5):4169-4176, Apr. 2011 online, May 2011 print.
Wang et al., "Electronically Selective Chemical Functionalization of Carbon Nanotubes: Correlation between Raman Spectral and Electrical Responses," 2005, *Journal of the American Chemical Society* 127(32):11460-11468, 9 pages.
Wu et al., "Transparent, Conductive Carbon Nanotube Films," *Science*, 305(5688): 1273-1276, Aug. 2004.
Zellner, "Global Aspects of Atmospheric Chemistry," H. Baumgartel, W. Grunbein, F. Hensel, Eds., *Topics in Physical Chemistry* (Springer, New York, 1999), pp. 10-14, 12 pages.
Zhang et al., "Hydrogenation and Hydrocarbonation and Etching of Single-Walled Carbon Nanotubes," 2006, *Journal of the American Chemical Society* 128, 6026-6027, 2 pages.
Zhang et al., "Photoisomerization of a Fullerene Dimer," Feb. 2008, *Journal of Physical Chemistry C*, 112, 2802-2804, 3 pages.
Zhang et al., "Selective Etching of Metallic Carbon Nanotubes by Gas-Phase Reaction," Nov. 2006, *Science*, 314: 974-977, 5 pages.
Zhang et al., "Transparent, Conductive, and Flexible Carbon Nanotube Films and Their Application in Organic Light-Emitting Diodes ," 2006, *Nano Lett.*, 6, 1880-1886, 7 pages.
Zheng et al., "Transition of Single-Walled Carbon Nanotubes from Metallic to Semiconducting in Field-Effect Transistors by Hydrogen Plasma Treatment," 2007, *Nano Letters*, 7(6):1622-1625, 4 pages.
Zhou et al., "Band Structure, Phonon Scattering, and the Performance Limit of Single-Walled Carbon Nanotube Transistors," *Phys. Rev. Lett.*, 95, 146805-1-146805-3, Sep. 2005.
Zhou et al., "Structural Characterization and Diameter-Dependent Oxidative Stability of Single Wall Carbon Nanotubes Synthesized by the Catalytic Decomposition of CO," Dec. 14, 2001, *Chemical Physics Letters*, 350:6-14, 9 pages.
PCT/US2011/034691 International Preliminary Report on Patentability, issued Nov. 6, 2012, 9 pages.
PCT/US2011/034691 International Search Report and Written Opinion, mailed Jan. 11, 2012, 13 pages.
U.S. Appl. No. 13/492,547, filed Jun. 8, 2012, 48 pages.
U.S. Appl. No. 13/740,955, filed Jan. 14, 2013, 62 pages.
UPSTO Transaction History; Apr. 24, 2013; United States; U.S. Appl. No. 12/625,543; 2 pages.
UPSTO Transaction History; Apr. 24, 2013; United States; U.S. Appl. No. 12/728,179; 2 pages.
UPSTO Transaction History; Apr. 24, 2013; United States; U.S. Appl. No. 12/940,674; 1 page.
UPSTO Transaction History; Apr. 24, 2013; United States; U.S. Appl. No. 13/447,105; 1 page.
UPSTO Transaction History; Apr. 24, 2013; United States; U.S. Appl. No. 13/492,547; 1 page.
UPSTO Transaction History; Apr. 24, 2013; United States; U.S. Appl. No. 13/740,955; 1 page.
International Search Report and Written Opinion; Kee IN, Bang; World Intellectual Property Organization (WIPO) (International Bureau of); Examiner; Publication Mailed; Oct. 29, 2012; PCT/US2012/031006; 8 pages.

* cited by examiner

HIGH PERFORMANCE FIELD-EFFECT TRANSISTORS

CROSS-REFERENCE TO RELATED APPLICATION

This application claims priority to U.S. Application Ser. No. 61/468,993, filed on Mar. 29, 2011, and entitled "Design and scalable fabrication approach for high performance field-effect transistors based on carbon nanomaterials," which is incorporated by reference herein in its entirety.

FEDERALLY SPONSORED RESEARCH OR DEVELOPMENT

This invention was made with government support under Grant No. 53-4502-6301 awarded by the National Science Foundation. The government has certain rights in the invention.

FIELD OF THE INVENTION

This invention is related to scalable high performance field-effect transistors.

BACKGROUND

Nanomaterials, such as graphene and carbon nanotubes (CNTs), hold great potential as materials for electronic components, due to remarkable properties such as extremely high charge carrier mobilities and current densities. Single atomic layer thickness provides ultimate electrostatic geometry for scaling down field-effect transistors (FETs). FETs fabricated with graphene and CNTs have shown improved performance compared to conventional semiconductor devices of the same size, but the performance of FETs fabricated with these carbon nanomaterials is far from their theoretical potential.

SUMMARY

In a first aspect, fabricating a high performance self-aligned field-effect transistor (FET) with a T-shaped gate electrode includes forming a source electrode and a drain electrode on a nanomaterial thin film, thereby defining a channel area between the source electrode and the drain electrode. The nanomaterial thin film is disposed on a substrate, and at least a portion of the nanomaterial thin film located outside the channel area is removed from the substrate. A resist is disposed over the source electrode, the drain electrode, and the nanomaterial thin film in the channel area, and a portion of the resist between the source electrode and the drain electrode is removed, thereby forming an opening in the resist between the source electrode and the drain electrode. The resist is developed, and an electrically conductive material is applied over the developed resist, thereby forming a gate electrode in the opening. The gate electrode includes a head region and a foot region. The foot region is in contact with a portion of the nanomaterial thin film in the channel area and has a length parallel to the surface of the nanomaterial thin film shorter than the maximum length of the head region parallel to the surface of the nanomaterial thin film. The developed resist is removed, and a dielectric layer is formed on the outer surface of the gate electrode. A metal layer is deposited over the source electrode, the drain electrode, the head region of the gate electrode, and a second portion of the nanomaterial thin film in the channel area. The head region of the gate electrode inhibits deposition of the metal layer over a third portion of the nanomaterial thin film proximate the foot region of the gate electrode (e.g., when the metal is deposited in a direction normal to the surface of the nanomaterial thin film.)

Implementations may include one or more of the following features. For example, the opening in the resist is a T-shaped opening, and forming the gate electrode includes forming a T-shaped gate electrode. Forming the source electrode and the drain electrode on the nanomaterial thin film includes depositing metal pads on the nanomaterial thin film. Removing at least the portion of the nanomaterial thin film located outside of the channel area includes etching the substrate. In some cases, disposing resist over the source electrode, the drain electrode, and the nanomaterial thin film in the channel area includes forming a bilayer resist mask or a trilayer resist mask. Removing the portion of the resist between the source electrode and the drain electrode includes exposing the portion of the resist to radiation. For example, exposing the portion of the resist to radiation includes exposing at least some of the portion of the resist to a first dose of radiation, and exposing the rest of the portion to a second dose of radiation, wherein the first dose of radiation is more energetic than the second dose of radiation.

In some cases, applying the electrically conductive material over the developed resist includes forming a unitary gate electrode in the opening. In certain cases, forming the dielectric layer on the outer surface of the gate electrode includes allowing the gate electrode to oxidize in air, and may include forming a dielectric layer between the foot region of the gate electrode and the portion of the nanomaterial thin film in contact with the foot region. Depositing the metal layer typically includes depositing the metal layer from a direction normal to the surface of the nanomaterial thin film. However, the metal layer may also be deposited from another angle. As described herein, depositing the metal layer over the source electrode, the drain electrode, the head region of the gate electrode, and a second portion of the nanomaterial thin film in the channel area includes self-aligning the source electrode and the drain electrode (e.g., the T-gate electrode is self-aligned). Fabricating a high performance self-aligned FET with a T-shaped gate electrode may also include disposing the nanomaterial thin film on the substrate before forming the source electrode and the drain electrode on the nanomaterial thin film.

Some implementations include a FET formed by the first aspect and/or a device including the FET formed by the first aspect.

In a second aspect, a FET includes a substrate, a nanomaterial thin film disposed on the substrate, a source electrode and a drain electrode formed on the nanomaterial thin film, and a channel area defined between the source electrode and the drain electrode. A gate electrode extends from the nanomaterial thin film in the channel area between the source electrode and the drain electrode, the gate electrode having an outer dielectric layer and comprising a foot region and a head region, the foot region in contact with a portion of the nanomaterial thin film in the channel area and having a length parallel to the surface of the nanomaterial thin film shorter than the maximum length of the head region parallel to the surface of the nanomaterial thin film. A metal layer is disposed over the source electrode, the drain electrode, the head region of the gate electrode, and portions of the nanomaterial thin film proximate the source electrode and the drain electrode in the channel area, wherein the portions of the nanomaterial thin film proximate the source electrode and the drain electrode in the channel area are defined by the projection of the head region of the gate electrode onto the nanomaterial thin film in the channel area (e.g., from a direction normal to surface of the nanomaterial thin film).

Implementations may include one or more of the following features. For example, the nanomaterial thin film may include conducting nanomaterials, semiconducting nanomaterials, or a combination thereof, such as nanomaterials selected from the group consisting of carbon nanotubes, graphene, graphene nanoribbons, and nanowires (e.g., conducting or semiconducting nanowires). The gate electrode is typically a unitary structure and/or T-shaped. In some cases, the channel length of the FET is at least 100 nm, 200 nm or less, or between 100 nm and 200 nm. In certain cases, the gate electrode includes aluminum, and the outer dielectric layer includes an oxide of aluminum. The gate electrode is typically self-aligned. In some cases, a current-gain cut-off frequency ($f_T$) of the field-effect transistor is in a range between 5 GHz and 25 GHz. Some implementations include a device including the FET of the second aspect.

Self-aligned FETs with T-shaped gate electrodes described herein provide advantages such as elimination of misalignment, reduction of access resistance by minimizing ungated graphene, and reduced gate charging resistance. The use of large-area nanomaterial thin film preparation, wafer scale transfer, and e-beam lithography to deposit T-shaped gate electrodes allows high-yield, scalable fabrication.

These general and specific aspects may be implemented using a device, system or method, or any combination of devices, systems, or methods. The details of one or more embodiments are set forth in the accompanying drawings and the description below. Other features, objects, and advantages will be apparent from the description and drawings, and from the claims.

BRIEF DESCRIPTION OF THE DRAWINGS

FIG. 7A shows scaled transistor current versus drain voltage. FIG. 7B shows scaled transistor current versus gate voltage. FIG. 7C shows scaled transconductance versus gate voltage.

FIG. 8A shows scaled transistor current versus drain voltage. FIG. 8B shows scaled transistor current versus gate voltage. FIG. 8C shows scaled transconductance versus gate voltage.

DETAILED DESCRIPTION

Figure 1A:
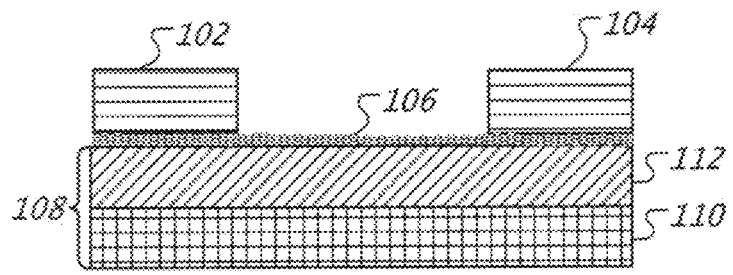
FIGS. 1A-1F depict fabrication of a self-aligned field-effect transistor (FET) with a T-shaped gate electrode. As used herein, "self-aligned FET" generally refers to a FET having a self-aligned gate electrode that serves as a mask during fabrication of the FET.

FIGS. 1A-1E depict fabrication of a high performance field-effect transistor (FET) with a T-shaped gate electrode ("T-gate electrode" or "T-gate"). FIG. 1A depicts source electrode 102 and drain electrode 104 formed over nanomaterial thin film 106 on substrate 108. In subsequent figures, nanomaterial thin film 106 is understood to be present but not shown between substrate 108 and source and drain electrodes 102 and 104. Substrate 108 is formed by methods generally known in the art and may include one or more layers. As shown in FIG. 1A, substrate 108 includes first layer 110 and second layer 112. First layer 110 is a high resistivity layer formed, for example, from silicon, quartz, sapphire, or an insulating material. When first layer 110 is an insulating material, substrate 108 may include first layer 110 in the absence of second layer 112. When present, second layer 112 is an insulator formed, for example, from silicon dioxide or another insulating material. In some instances, second layer 112 is between about 100 nm and about 500 nm thick (e.g., about 300 nm thick).

Nanomaterial thin film 106 may include conducting nanomaterials, semiconducting nanomaterials, or a combination thereof, such as, for example, graphene, graphene nanoribbons, carbon nanotubes (CNTs), nanowires, and the like, or a combination thereof. Nanomaterial thin film 106 is formed by methods including solution-based deposition, array transfer, chemical vapor deposition (CVD), or the like, and then transferred to the surface of substrate 108. Source electrode 102 and drain electrode 104 are pads formed from a metal such as titanium or palladium over nanomaterial thin film 106 on substrate 108 by methods generally known in the art (e.g., a lift-off process). After formation of source electrode 102 and drain electrode 104 on nanomaterial thin film 106, nanomaterial thin film outside the channel area between the source electrode and the drain electrode is removed, thereby defining the active area between the source and drain electrodes. In some cases, a large number of active areas are defined with standard lithographical methods by depositing metal pads for multiple source electrodes 102 and drain electrodes 104 on nanomaterial thin film 106, and removing the nanomaterial thin film outside the channel areas (e.g., outside the area between each pair of source and drain electrodes) in, for example, an etching process. FETs are then fabricated using a scalable self-aligned approach based on a T-shaped gate stack.

Figure 1B:
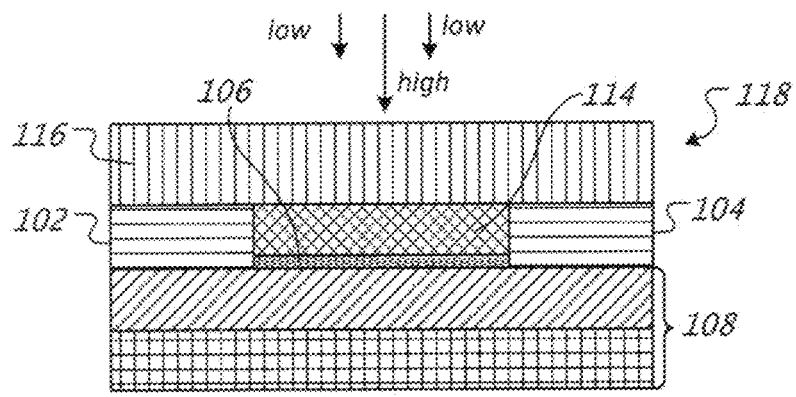
Figure 1C:
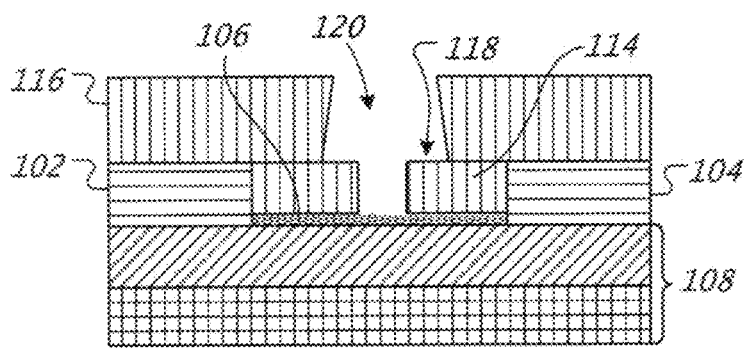

In FIG. 1B, first polymeric layer 114 is formed on nanomaterial thin film 106 in the channel area between source electrode 102 and drain electrode 104. Second polymeric layer 116 is formed on first polymeric layer 114, covering source electrode 102 and drain electrode 104. First and second polymeric layers 114, 116 may be formed of resist (e.g., electron-beam resist, photoresist, or the like) in a lithographic method generally known in the art, resulting in a bilayer resist mask 118. In some cases, a trilayer mask is used. In an example of a bilayer mask, first polymeric layer 114 is poly (methyl methacrylate) (PMMA) with a molecular weight of about 950 k, and second polymeric layer 116 is a copolymer of PMMA and poly(methyl methacrylate-methacrylic acid) (PMMA), or P(MAA-MAA). A line in the bilayer resist is exposed, for example, by a high dose electron beam high followed by adjacent low dose electron beam low to form T-shaped opening 120, as shown in FIG. 1C, with the high dose exposure area defining a foot portion of the T-shaped opening and the low dose exposure defining a head portion (or T-cap) of the T-shaped opening. The resist is then developed by a process generally known in the art (e.g., with a developer such as mixture of 4-methyl-2-pentanone and isopropanol in a 1:3 ratio).

Figure 1D:
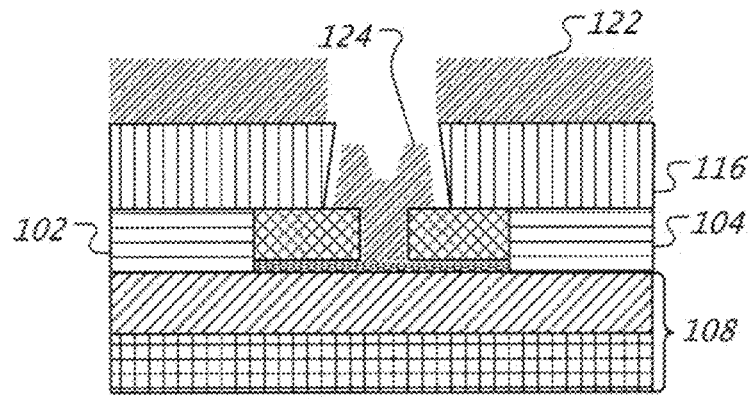
Figure 1E:
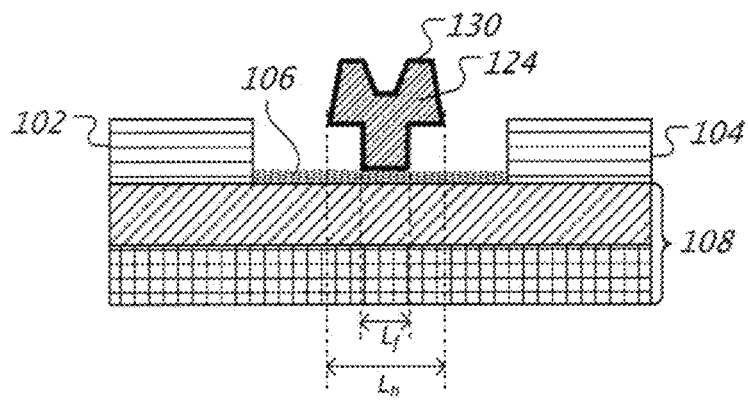

A deposition process simultaneously forms layer 122 on bilayer resist mask 118 as well as gate electrode 124 between source electrode 102 and drain electrode 104, as shown in FIG. 1D. The deposition may be achieved by one of several processes, such as sputtering, e-beam evaporation, or thermal evaporation of a metal with a self-limiting oxidation process (e.g., aluminum). The side wall profile of the bilayer resist mask allows easy lift-off of bilayer resist mask 118, leaving T-shaped gate electrode 124 between source electrode 102 and drain electrode 104, as shown in FIG. 1E. T-shaped gate electrode 124 includes foot 126 having length $L_f$ at its base on nanomaterial thin film 106 and head 128 having maximum length $L_h$ in the cross section of FET 100 shown in FIG. 1E (i.e., a plane perpendicular to the surface of nanomaterial thin film 106 and through the source and drain electrodes). Maximum length $L_h$ is used herein to refer to the distance from a first outer surface to a second outer surface of head 128 in a plane parallel to the surface of nanomaterial thin film 106, regardless of whether the head is continuous (solid) or discontinuous (with one or more openings) across the length $L_h$. As used herein, a "T-shaped gate electrode" generally refers to an electrode having a first region and a second region, the first region (foot) extending from the substrate (or nanomaterial thin film) and having length $L_f$ at its base smaller than maximum length $L_h$ of the second region (head) as shown in FIG. 1E. Thus, when viewed from a direction above T-shaped gate electrode 124 and perpendicular to nanomaterial thin film 106, head 128 serves as a shadow mask, covering part of the nanomaterial thin film 106 closest to the base of foot 126.

A cross-sectional shape of a "T-shaped" gate electrode in a plane perpendicular to nanomaterial thin film 106 may have an appearance that resembles a Y-shape, a mushroom shape, a T-shape, or any regular or irregular, symmetrical or asymmetrical shape that includes the first region extending from the substrate and having a smaller length in a plane parallel to the surface of nanomaterial thin film 106 than the second region. In some cases, as shown in FIG. 1G, head 128 includes portions 128' and 128" overlapping foot 126, with the maximum length $L_h$ of head 128 measured from an outer surface of portion 128' to an outer surface of portion 128" (i.e., through an opening between portions 128' and 128").

Referring back to FIG. 1E, subsequent oxidation of T-shaped gate electrode 124 forms a thin oxide layer 130 on outer surfaces of the T-shaped gate electrode, as well as between foot 126 and nanomaterial thin film 106. For an aluminum T-shaped gate electrode, oxidation occurs in air and is self-limiting. A thickness of the oxide layer can range between about 1 nm and about 10 nm (e.g., between about 3 nm and about 5 nm). Formation of oxide layer 130 between the bottom of foot 126 and nanomaterial thin film 106 is believed to occur based at least in part on weak interactions (and thus poor wetting) between the metal used to form T-shaped gate electrode 124 and nanomaterial thin film 106. The one-step fabrication of T-shaped gate electrode 124 shown in FIG. 1D (i.e., fabrication of foot 126 and head 128 of the T-shaped gate electrode in a single deposition step) simplifies the fabrication process by forming the T-shaped gate electrode as a unitary structure in one step (e.g., rather than forming the foot in a first step, and forming the head on the foot in a second step). Oxidation in air of the T-shaped gate electrode provides excellent gate capacitance (e.g., dielectric constant of about 6 to about 10 with an oxide thickness between about 3 nm and about 5 nm).

Figure 1F:
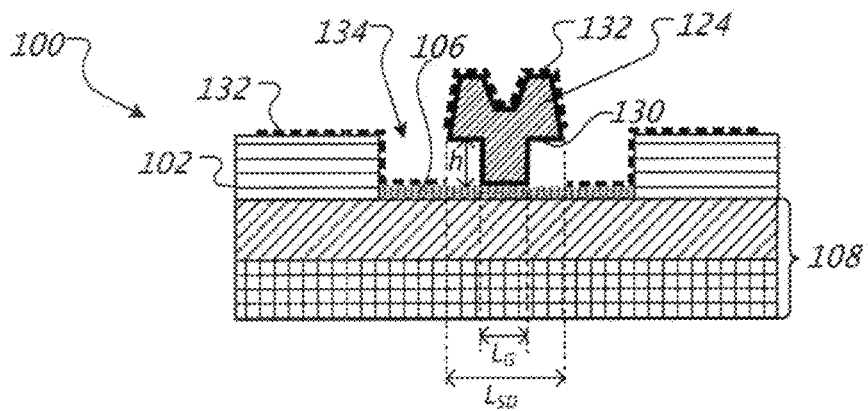
Figure 1G:
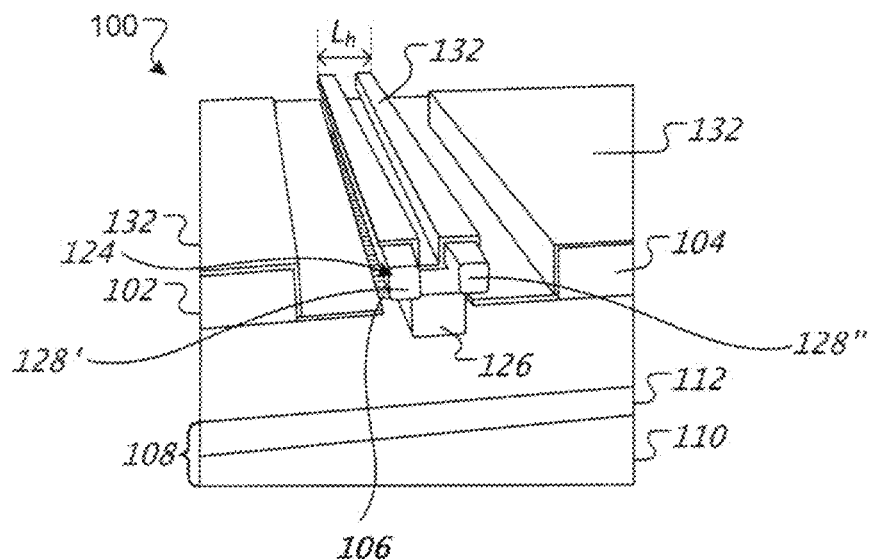
FIG. 1G is a perspective view of a self-aligned FET with a T-shaped gate electrode.

After formation of oxide layer 130, a thin source/drain metal layer 132 is formed over source electrode 102, drain electrode 104, T-shaped gate electrode 124, and a portion of nanomaterial thin film 106 in channel area 134 (between source electrode 102 and drain electrode 104) from a direction normal to the surface of the nanomaterial thin film 106 to yield FET 100, as shown in FIG. 1F. Metal layer 132 may include, for example, palladium or platinum. When the height h of foot 126 exceeds the thickness of the source/drain metal layer, T-shaped gate electrode 124 provides electrical insulation and alignment between source electrode 102, drain electrode 104, and T-shaped gate electrode 124. In some cases, the height h of foot 126 may be in a range from 50 nm to 100 nm. In one example, a thickness of source/drain metal layer 132 is about 10 nm. This thickness provides high conductance to the external leads and also provides low contact resistance with nanomaterial thin film 106.

Utilization of T-shaped gate electrode 124 as a shadow mask for deposition of metal layer 132 aligns source electrode 102 and drain electrode 104 to the T-shaped gate electrode, forming FET 100 with source to drain contact length $L_{SD}$ and gate length $L_G$. As described herein, FET channel length $L_C$ is equal to the gate length, since the gate dielectric thickness is much thinner than the gate length. In some cases, channel length $L_C$ is in a range from 100 nm to 200 nm. A length $L_f$ of foot 126 can be selected (e.g., by selection of exposure time to the high dose electron beam referred to with respect to FIG. 1B) to define the FET channel length, and a length $L_h$ of head 128 can be selected (e.g., by selection of exposure time to the low dose electron beam referred to with respect to FIG. 1B) to define the source-drain spacing. The alignment of source, drain, and gate electrodes and the selection of channel length and source-drain spacing allow for implementation of dimensions selected to reduce parasitic capacitance. Parasitic resistance can be reduced by increasing the height of the T-shaped electrode. The maximum height of the T-shaped electrode may range, for example, from 120 nm to 200 nm (e.g., 150 nm).

Figure 1H:
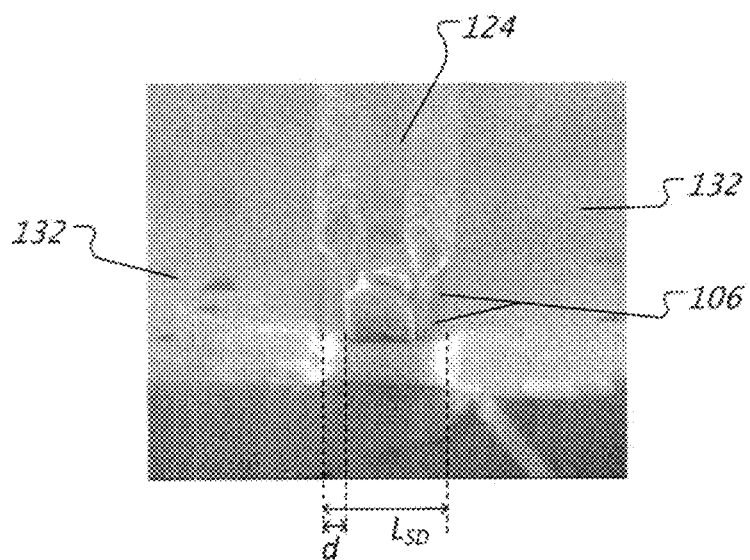
FIG. 1H is a scanning electron microscope (SEM) image of a self-aligned FET with a T-shaped gate electrode.

FIG. 1G is a perspective view of self-aligned FET 100 with a T-shaped gate electrode 124, showing source electrode 102, drain electrode 104, nanomaterial thin film 106, and substrate 108 having first layer 110 and second layer 112. Source electrode 102 and drain electrode 104 are self-aligned, with nanomaterial thin film 106 visible between metal layer 132 and T-shaped gate electrode 124. FIG. 1H is an SEM image of a portion of a self-aligned FET obtained after cleaving the substrate across the transistor channel, showing T-shaped gate electrode 124, metal layer 132, and nanomaterial thin film 106. Although the metal source electrode and drain electrode are not shown, these electrodes are precisely aligned with T-shaped gate electrode 124, and well separated with short sections of ungated nanomaterial thin film 106, forming an air gap or separation distance d (shown in FIG. 1H), corresponding to the length of ungated nanomaterial sections, which leads to a reduction of the parasitic fringe capacitance.

The separation distance d is controlled by the maximum length $L_h$ of the T-gate head or cap 128 relative to the length $L_f$ of the T-gate foot or base 126, which can be adjusted by the bilayer exposure recipe. Maximum length $L_h$ of the T-gate head or cap 128 may be in a range of 50 nm to 250 nm (e.g., 75 nm to 250 nm, 100 nm to 200 nm, or 110 nm to 170 nm), and the length of the ungated nanomaterial sections d may be in a range between about 10 nm and 50 nm (e.g., 20 nm to 40 nm). Although a very wide head or T-cap can be used to reduce gate charging resistance (e.g., with a trilayer resist), here a relatively narrow head or T-cap is used, as a wide T-cap can lead to large area of ungated nanomaterial thin film and thus high access resistance between the self-aligned source/drain and gated nanomaterial thin film. For T-shaped gated electrodes with geometries described herein, use of a bilayer resist mask provides desirable results and is simpler to process than a trilayer recipe.

FETs as described herein allow simultaneous reduction of the access resistance, fringe gate-source, gate-drain capacitance, and gate resistance. The length d of the ungated sections can be further reduced by angle deposition of the source/drain metal film, which may lead to a trade-off between further reduction of the access resistance and increase of the parasitic fringe capacitance. Based on calculations using gate dimension and experimental measurements, the gate charging resistance is estimated to be about 1 Ω/μm of the gate width for a FET having a channel length $L_C$ of 100 nm.

Preparation of nanomaterial thin films. As noted with respect to FIG. 1A, nanomaterial thin films used in the fabrication of FETs described herein can be prepared by a number of processes. The prepared nanomaterial thin films are transferred to a substrate, and active areas are defined with lithographical methods generally known in the art by depositing metal pads (source and drain electrodes) and removing the nanomaterial thin films outside the channel area between the source and drain electrodes. Preparation of large-area nanomaterial thin films in this manner allows scalable, registration-free fabrication and integration of nanomaterials into FETs.

Figure 2A:
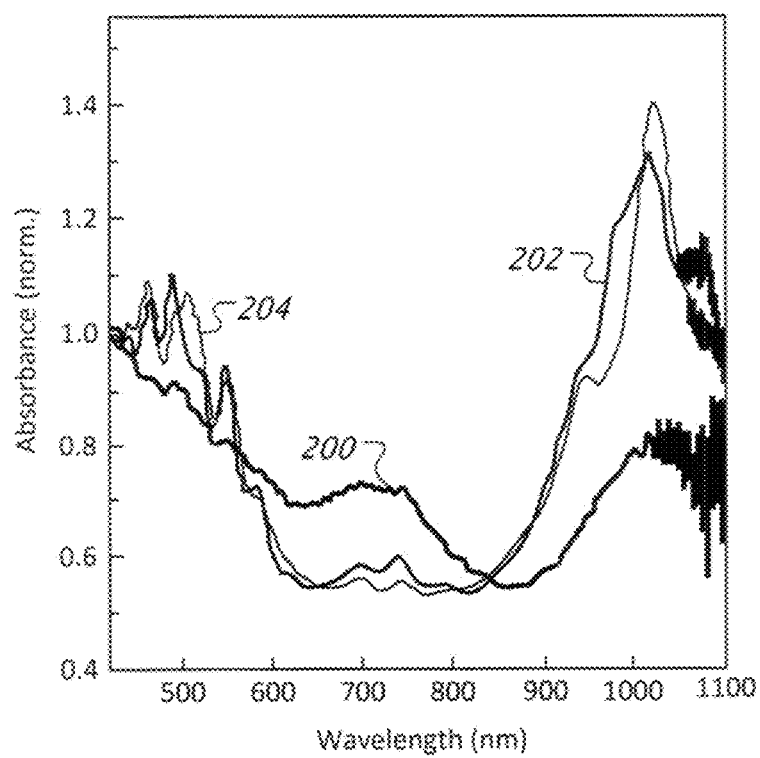
FIG. 2A shows ultraviolet—visible—and near infrared absorption spectra of mixed, 95% semiconducting, and 98% semiconducting nanotube solutions.
Figure 2B:
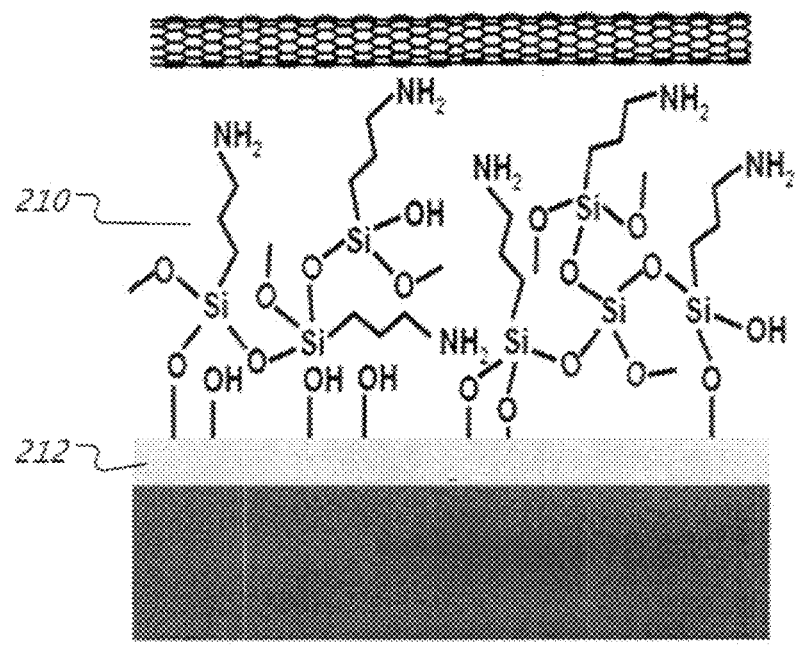
FIG. 2B depicts aminopropyltriethoxysilane assisted separated nanotube deposition on Si/SiO$_2$ substrate.
Figure 2C:
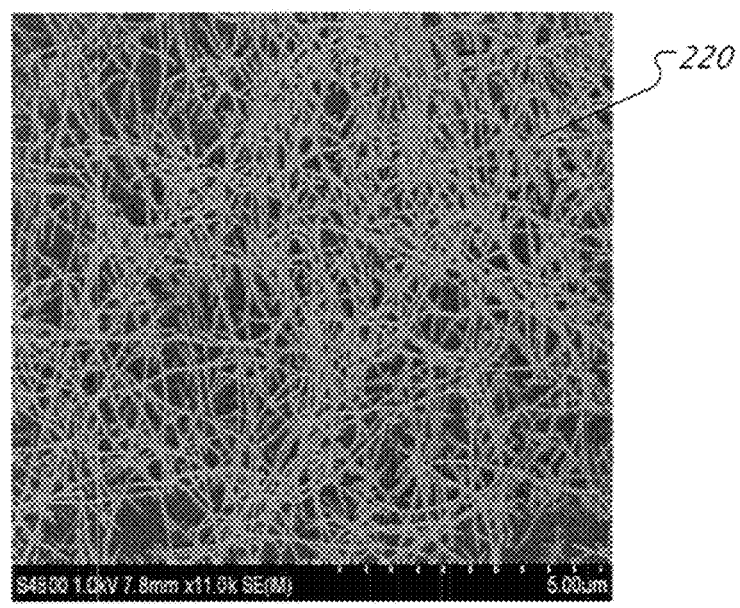
FIG. 2C is an SEM image of a thin film network of separated nanotubes using solution based techniques.

Solution-based deposition. Semiconducting nanotubes used to form a nanomaterial thin film can be separated from metallic nanotubes with solution methods (e.g., ultra-high speed centrifugation in a density gradient), as described in U.S. Patent Application Publication No. 2011/0101302 and C. Wang et al., "Wafer-Scale Fabrication of Separated Carbon Nanotube Thin-Film Transistors for Display Applications," Nano Letters, vol. 9, pp. 4285-4291, both of which are incorporated by reference herein. Plots 200, 202, and 204 in FIG. 2A show ultraviolet-visible-near infrared absorption spectra of mixed nanotubes, 95% semiconducting nanotubes, and 98% conducting nanotubes, respectively. A semiconducting nanotube thin film is deposited on a substrate through incubation in a separated nanotube solution, followed by rinsing with deionized water. An adhesion layer may be disposed on the substrate before the substrate is contacted with the nanotube solution to improve the adhesion between nanotubes in the solution and the substrate. Suitable adhesive materials include, for example, aminopropyltriethoxysilane (APTES) and poly-L-lysine solution. FIG. 2B depicts interaction between APTES 210 and silica substrate 212, in which condensation reactions occur between hydroxyl groups on the substrate surface and alkoxy groups in the silane. Nanotube density on the substrate can be selected by adjusting the concentration of the nanotube solution. FIG. 2C shows an SEM image of nanotube network 220 formed by deposition of a semiconducting nanotube solution on a substrate using this solution-based approach.

Figure 3A:
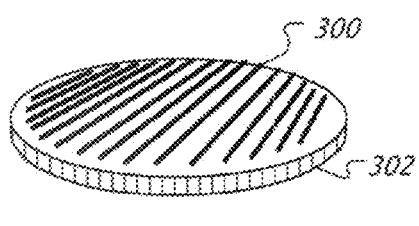
FIGS. 3A-3D depict the synthesis of nanotube arrays on a first substrate and transfer of the synthesized arrays to a second substrate.
Figure 3B:
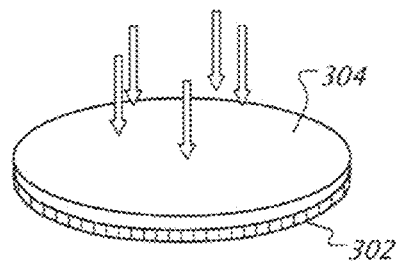
Figure 3C:
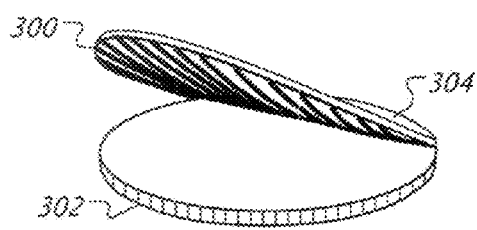
Figure 3D:
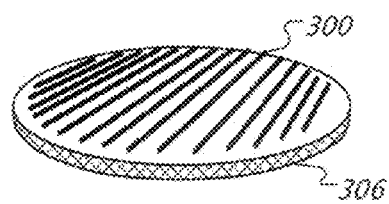

Synthesis and transfer of aligned dense arrays of nanotubes. In this method, described in U.S. Patent Application Publication No. 2010/0133511, U.S. Patent Application Ser. No. 61/117,519, and K. Ryu et al., "CMOS-Analogous Wafer-Scale Nanotube-on-Insulator Approach for Submicrometer Devices and Integrated Circuits Using Aligned Nanotubes," Nano Letters, vol. 9, pp. 189-197, all of which are incorporated by reference herein, nanotubes are synthesized by chemical vapor deposition on top of a substrate (e.g., sapphire or quartz). The growth of nanotubes is guided by the crystal lattice of the substrate, yielding dense arrays of long, highly aligned nanotubes. The nanotube arrays can be transferred onto another substrate as shown in FIGS. 3A-3D. In FIG. 3A, nanotubes are shown aligned in arrays 300 on substrate 302. In FIG. 3B, layer 304 (e.g., gold film or PMMA) is deposited over nanotube arrays 300 (not shown). In FIG. 3C, metallic layer 304, with attached nanotube arrays 300, is peeled away from substrate 302. In FIG. 3D, nanotube arrays 300 are transferred to a second substrate 306 (e.g., silicon or silicon dioxide) with a high or nearly perfect yield.

Figure 4A:
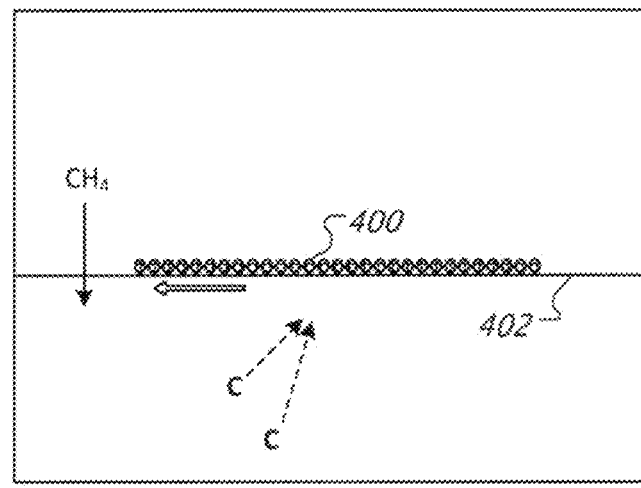
FIG. 4A depicts formation of graphene by chemical vapor deposition (CVD) on nickel.
Figure 4B:
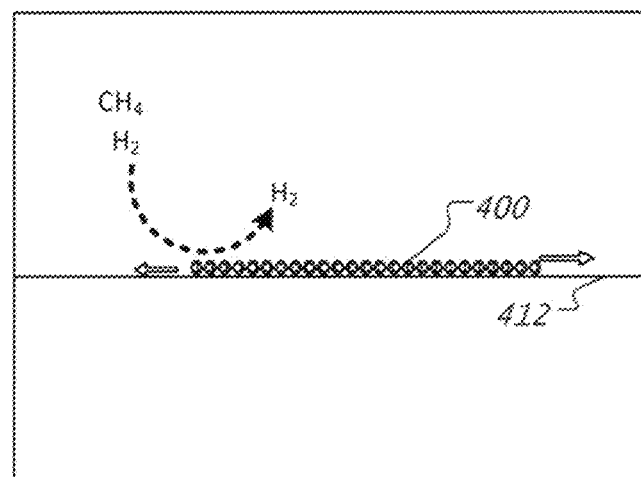
FIG. 4B depicts formation of graphene by CVD on copper.
Figure 4C:
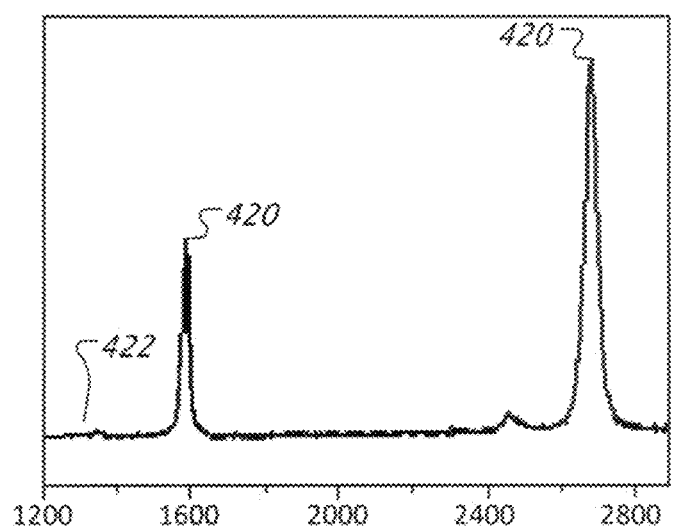
FIG. 4C shows a Raman spectrum of a graphene film grown by CVD on copper and transferred to a Si/SiO$_2$ substrate.

Large-area graphene film synthesis by chemical vapor deposition and transfer. In this method, described in U.S. patent application Ser. No. 12/576,234 and Y. Zhang et al., "Comparison of Graphene Growth on Single-Crystalline and Polycrystalline Ni by Chemical Vapor Deposition," Journal of Physical Chemistry Letters, vol. 1, pp. 3101-3107, both of which are incorporated by reference herein, graphene films having one or more layers are synthesized by catalytic chemical vapor deposition of carbohydrates on a transition metal surface (e.g., nickel or copper). This method is suitable for large-area graphene synthesis, for example, on a wafer having a diameter of 3 to 4 inches. FIG. 4A illustrates the formation of graphene film 400 on nickel substrate 402. FIG. 4B illustrates the formation of graphene film 400 on copper substrate 412. Graphene films 400 can be released from substrates 402 and 412 by etching the substrate to release the graphene film, and then transferring the graphene film to a second substrate (e.g., silicon or silicon dioxide). FIG. 4C shows a Raman spectrum of a transferred graphene film, with peaks 420 and 422 corresponding to the G-band (graphitic carbon) and (two phonon) 2D-band, respectively. The transferred graphene films are uniform and continuous, with over 90% of the surface area having only a single graphene layer.

Other methods. Other suitable preparation methods for nanomaterial thin films including, for example, epitaxial graphene growth on silicon carbide substrates, described by C. Dimitrakopoulos et al. in "Wafer-scale epitaxial graphene growth on the Si-face of hexagonal SiC (0001) for high frequency transistors," Journal of Vacuum Science & Technology B, vol. 28, pp. 985-992, which is incorporated by reference herein, and deposition of graphene films from solution, may also be used in the fabrication of FETs.

Example. An exemplary self-aligned graphene FET with T-shaped Al/Al$_2$O$_3$ gate electrode was fabricated as described with respect to FIGS. 1A-1F. Large area single-layer graphene films were synthesized on copper foils by a low pressure CVD method and subsequently transferred onto highly resistive silicon wafer ($\rho$>5 k$\Omega$·cm) with 300 nm thick top SiO$_2$ layer. Titanium/palladium (0.5/50 nm) probing pads were first patterned using contact aligner and lift-off process. After this, bilayer electron beam resist, with the top layer, a copolymer of methyl methacrylate and methacrylic acid P(MMA-MAA), being more sensitive than the bottom layer, polymethyl methacrylate (PMMA) with 950 k molecular weight, was used to fabricate a T-shaped top gate stack. The bilayer resist was exposed with high dose electron beam radiation at the gate position center and low dose electron beam radiation at the adjacent area in the same exposure run. After the deposition of aluminium film (140 nm), a standard lift-off process was used to produce the T-shaped gate stack. The Al gate electrodes were then oxidized in air, forming a thin dielectric layer between the graphene and Al gate. Finally, a thin layer of palladium (12 nm) was deposited on top of the T-shaped gate electrode to create aligned source and drain electrodes for the graphene FET.

Figure 5A:
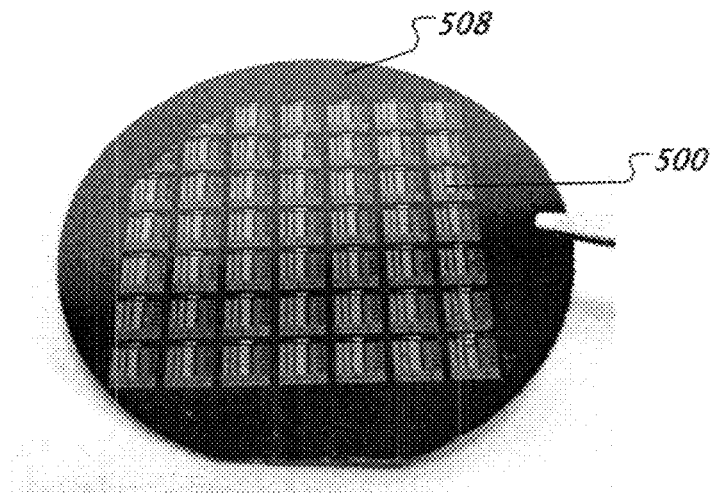
FIG. 5A is a photograph of a 2 inch silicon wafer with fabricated self-aligned graphene FETs having T-shaped gate electrodes.
Figure 5B:
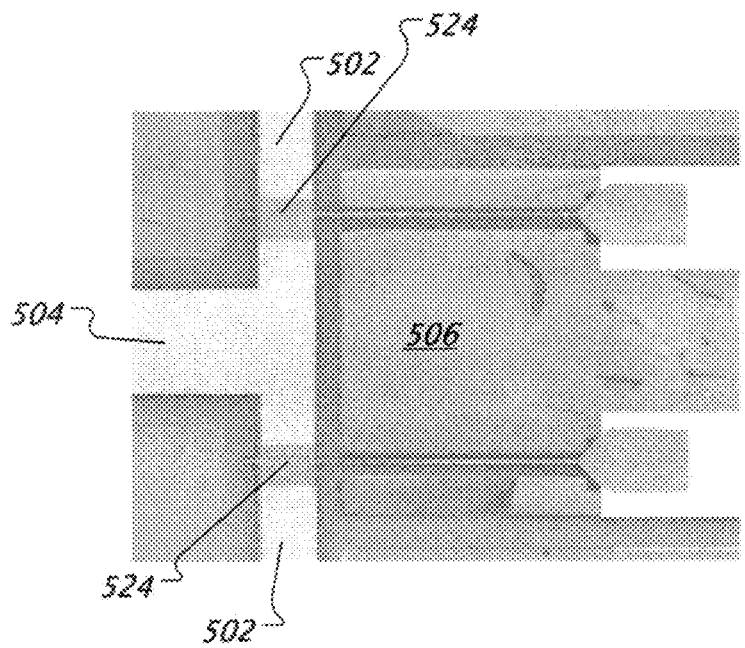
FIG. 5B is an SEM image of a self-aligned graphene FET having a dual gate configuration.

The above-mentioned fabrication method facilitated highly scalable and reliable fabrication of graphene transistors on complete Si wafers. CVD graphene synthesis on copper foils is readily extendable to very large areas by rolling up the foil. Graphene synthesis on copper foils as large as 12 inch in a 4 inch was achieved in a CVD chamber, and the synthesized graphene was successfully transferred to 12 inch Si wafers. Fabrication of self-aligned FETs with T-shaped gate electrodes was carried out on 2 inch Si wafers due to the limitation of available lithography equipment. FIG. 5A is a photograph showing self-aligned graphene FETs 500 fabricated on a 2 inch Si wafer 508. FIG. 5B is a top-view SEM image of a self-aligned graphene FET 500 having a dual gate configuration, showing source electrode 502, drain electrode 504, graphene 506, and T-shaped gate electrode 524 of FET 500. The scale bar in FIG. 5B corresponds to 10 $\mu$m.

Figure 6A:
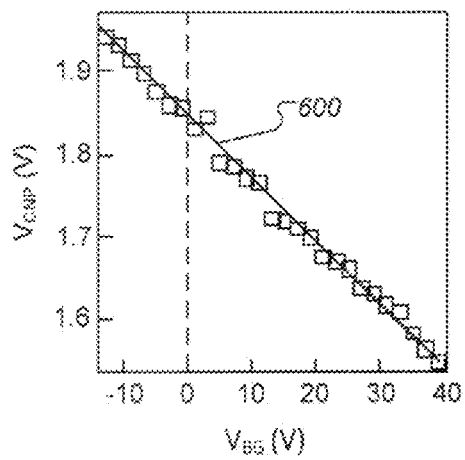
FIG. 6A is a plot showing conductance of a self-aligned graphene FET with a T-shaped gate electrode as a function of top gate and back gate voltages.
Figure 6B:
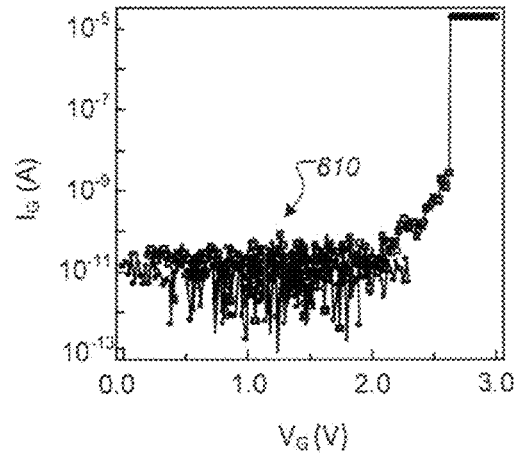
FIG. 6B shows gate leakage current of self-aligned graphene FETs with T-shaped gate electrodes.

Performance of the T-shaped Al/Al$_2$O$_3$ gate stack was characterized using electrical measurements. Conductance of a graphene FET as a function of the top gate voltage $V_G$ and the back gate voltage $V_{BG}$ was assessed. By comparing the shift of the charge neutrality point $V_{CNP}$ (defined as the top gate voltage at the minimum conductance point) with the change of the back gate voltage $V_{BG}$, the ratio of top gate dielectric capacitance to the bottom gate dielectric capacitance was found to be about 130, as calculated from plot 600 in FIG. 6A. For a 300 nm thick SiO$_2$ back gate dielectric, the back gate and top gate capacitances were estimated to be 11.8 nF/cm$^2$ and 1500 nF/cm$^2$, respectively. This capacitance corresponds to a dielectric with effective oxidation thickness (EOT) of 2.3 nm, and hence the thickness of the Al$_2$O$_3$ dielectric is estimated to be about 3 to 5 nm. The Al$_2$O$_3$ dielectric exhibited excellent insulator behavior with nearly 100% yield across all the devices. Plots 610 in FIG. 6B shows the gate leakage current (both source and drain grounded) of several self-aligned graphene FETs with T-shaped gate electrodes, indicating that the dielectric breakdown voltage is higher than 2.5 V.

Figure 6C:
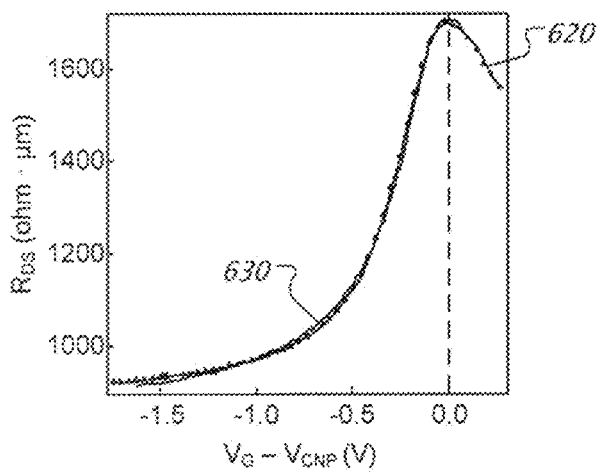
FIG. 6C shows scaled resistance versus top gate voltage of a self-aligned graphene FET with a T-shaped gate electrode.

This fabrication method provides a simple and reliable method to obtain gate stacks with high-quality dielectric for graphene devices. The mobility $\mu$ and contact resistance $R_C$ of a graphene FET can be extracted by fitting the source-drain linear resistance $R_{DS}$ with the formula: $R_{DS}W = 2R_C W + L/[\mu e (n_0^2 + n^2)^{1/2}]$, where L is the channel length or gate length, W is the channel width, $n_0$ is the residual carrier density, and n is the carrier density due to top gate modulation. Plot 620 in FIG. 6C shows the experimental data, and plot 630 shows the fit of scaled resistance versus top gate voltage of a graphene FET with 170 nm channel length, having a hole mobility equal to 1500 cm$^2$/V·s, residual carrier concentration $n_0$ of 5×10$^{11}$ cm$^{-2}$, and scaled contact resistance $R_C W$ of about 400 $\Omega$·$\mu$m.

Figure 7A:
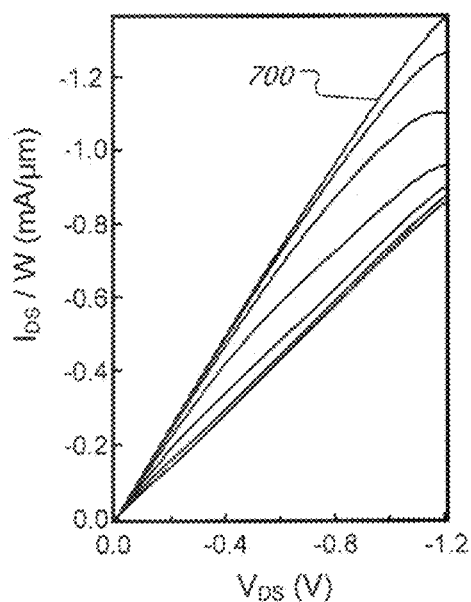
FIGS. 7A-7C show DC output and transfer characteristics of a self-aligned graphene FET with a T-shaped gate electrode and having a channel length of 170 nm.
Figure 7B:
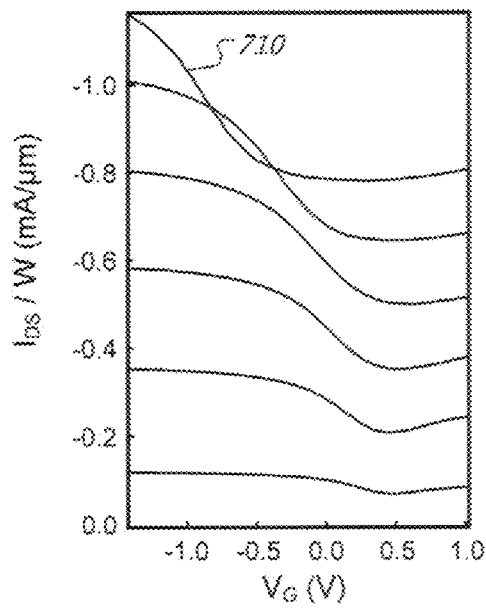
Figure 7C:
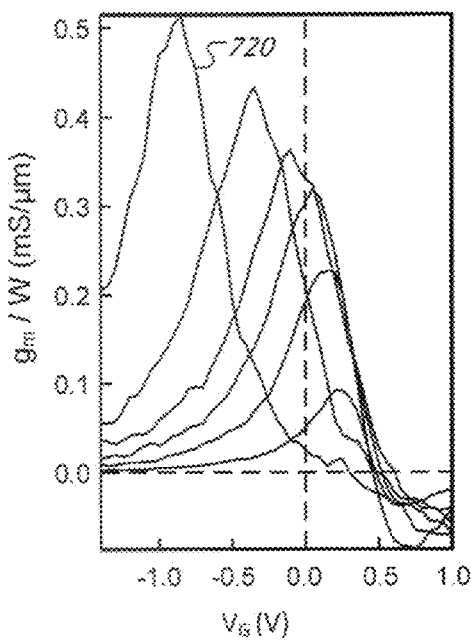
Figure 8A:
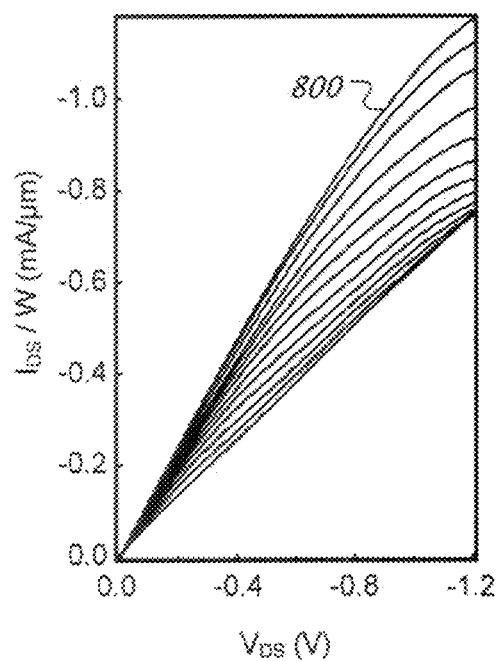
FIGS. 8A-8C show DC output and transfer characteristics of a self-aligned graphene FET with a T-shaped gate electrode and having a channel length of 110 nm.
Figure 8B:
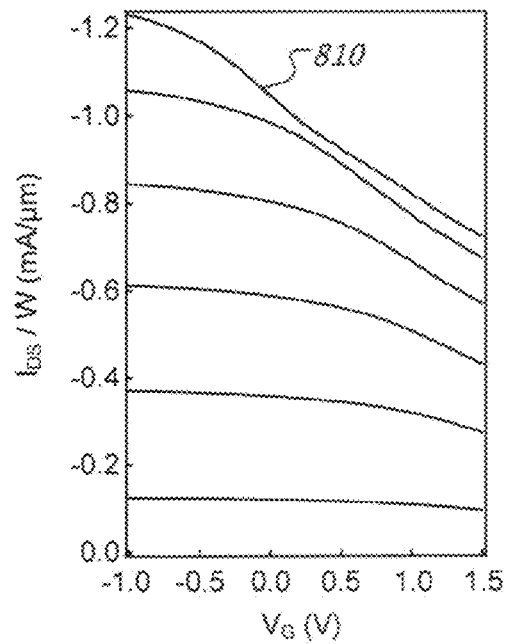
Figure 8C:
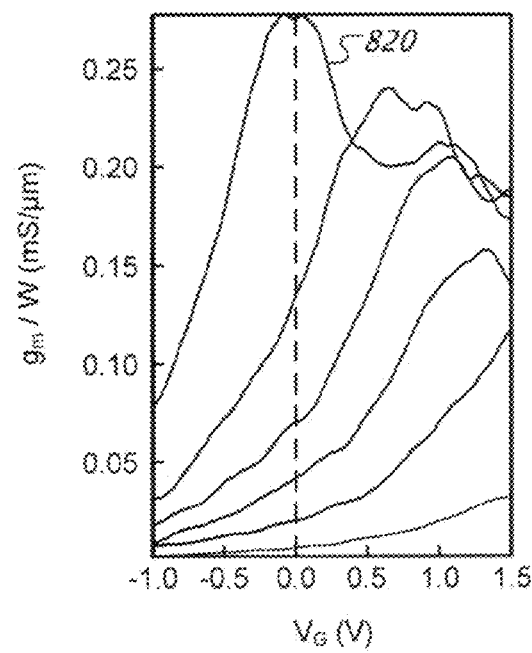

FIGS. 7A-7C show the output and transfer characteristics of a graphene FET with a channel length of 170 nm, and FIGS. 8A-8C show the output and transfer characteristics of a graphene FET with a channel length of 110 nm. Back gate (substrate) voltage was kept constant and equal to 0 V for all plots. For the output characteristics (FIG. 7A), the drain voltage sweeps from 0 V to −1.2 V, with the top gate voltage step of +0.2 V starting from −1.6 V for plot 700. The transistors exhibit large drive current densities up to 1.3 mA/$\mu$m and ~50% gate modulation, as well as appreciable current saturation with output conductance as low as 0.2 mS/$\mu$m. The transfer curves (FIG. 7B) and transconductance curves (FIG. 7C) are obtained with gate voltage swept from −1.5 V to 1 V, and the drain voltage varied from −1.1 V to −0.1 V (in −0.2 V steps) from the top to bottom curves starting from plots 710 and 720 in FIGS. 7B and 7C, respectively. The saturation in $I_D$-$V_{DS}$ curves at intermediate gate voltages shown in FIG. 7A is believed to be a result of the presence of the minimal density point close to the drain under the right combination of gate voltage and drain voltage. A peak scaled transconductance $g_m$/W up to 0.5 mS/$\mu$m was achieved for the 170 nm device.

FIGS. 8A-8C show similar data for a graphene FET with a 110 nm channel length. For the output characteristics (FIG. 8A), the drain voltage sweeps from 0 V to −1.2 V, with the top gate voltage step of +0.2 V starting from −1.6 V for plot 800. The transfer curves (FIG. 8B) and transconductance curves (FIG. 8C) are obtained with gate voltage swept from −1.5 V to 1 V, and the drain voltage varied from −1.1 V to −0.1 V (in −0.2 V steps) from the top to bottom curves starting from plots 810 and 820 in FIGS. 8B and 8C, respectively. As shown in FIGS. 8A-8C, the on/off current ratio and transconductance of the FETs with 110 nm channel length are lower than those of the transistors with 170 nm channel length. For example, the peak transconductance, for 110 nm channel length is measured to be 0.27 mS/$\mu$m (FIG. 8C). One possible reason is the significant contact resistance in the graphene FETs has more pronounced influence on the performance of short channel transistors than long channel transistors. Moreover, quasi-ballistic transport and strong interband tunneling in graphene may exert influence on short channel transistors.

The high frequency performance of the graphene FETs was further characterized by standard on-chip S-parameter measurements with a vector network analyzer over the frequency range of 0.05 to 10 GHz. The measurements were first calibrated to the probe tips using an off-chip calibration substrate by a standard short-open-load-through (SOLT) procedure. A de-embedding procedure was then used to eliminate the effect of the co-planar waveguide pads on the RF performance by measuring on-chip 'open' and 'short' test structures. The 'open' test structure consisted of only large photolithography-defined pads outside the active area of the transistors, while the short test structure has additional metal film shorting the gate-source and drain-source pads. The S-parameters after this de-embedding procedure are determined by the graphene transistor channel, top gate electrode with gate interconnect, and ~1 $\mu$m long metal source and drain electrodes outside the channel. The de-embedded results are referred to as the 'device' performance, since it is the performance that is accessible for actual integrated on-chip circuits.

Figure 9:
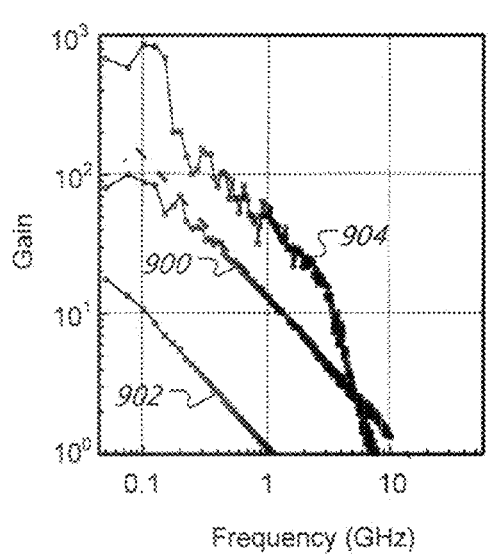
FIG. 9 shows RF performance of a self-aligned graphene FET with a T-shaped gate electrode and having a channel length of 170 nm.
Figure 10:
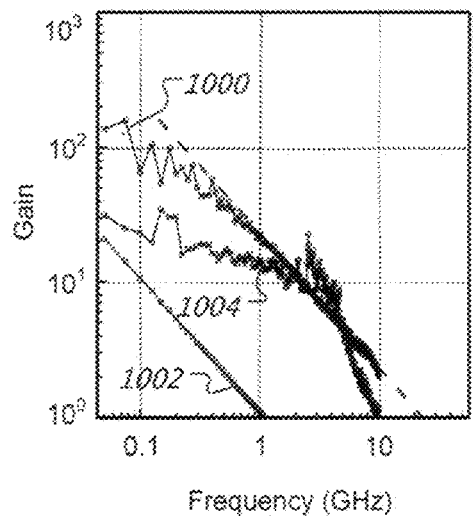
FIG. 10 shows RF performance of a self-aligned graphene FET with a T-shaped gate electrode and having a channel length of 110 nm.

Plots 900 and 902 in FIG. 9 show the current gain ($H_{21}$ device and $H_{21}$ measured, respectively), and plot 904 shows maximum available gain (MAG) for a self-aligned graphene FET with a channel length of 170 nm. The 'measured' and 'device' current gains are the results before and after the de-embedding procedure, respectively. Plots 1000 and 1002 in FIG. 10 show the current gain ($H_{21}$ device and $H_{21}$ measured, respectively), and plot 1004 shows maximum available gain (MAG) for a self-aligned graphene FET with a channel length of 110 nm. A current-gain cut-off frequency ($f_T$) of 15 GHz and maximum oscillation frequency ($f_{max}$) of 8 GHz were obtained for the 170 nm device, and $f_T$ of 23 GHz and $f_{max}$ of 10 GHz were obtained for the 110 nm device. Other FETs fabricated in a similar manner showed $f_T$ in the range of 5 GHz to 25 GHz.

Figure 11:
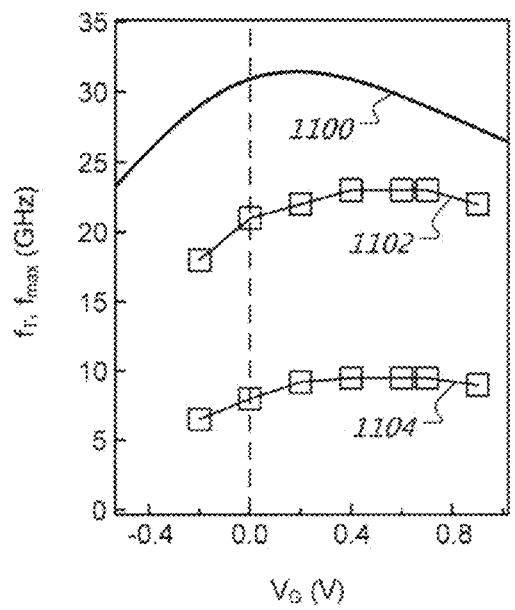
FIG. 11 shows plots of frequency and intrinsic gate delay versus gate bias for a self-aligned graphene FET with a T-shaped gate electrode and having a channel length of 110 nm.

The highest achievable current-gain cut-off frequency in a FET is limited by the intrinsic gate delay and given by $f_T=g_m/2\pi C_g$, where $C_g$ is the total gate capacitance. FIG. 11 shows frequency behavior versus gate bias ($V_G$) for the self-aligned graphene FET with a channel length of 110 nm. Plots 1100, 1102, and 1104 show $g_m/2\pi C_G$, current-gain cut-off frequency ($f_T$), and maximum oscillation frequency ($f_{max}$), respectively, versus gate bias, allowing comparison of the intrinsic gate delay frequency which is evaluated from the DC measurements of the transconductance and gate capacitance, and the 'device' current-gain cut-off frequency and maximum oscillation frequency from the RF measurements. The 'device' current-gain cut-off frequency is relatively close to the intrinsic gate delay frequency value, suggesting that the parasitic effects of the T-shaped gate transistor play a small role and justifies the improved device design.

Owing at least in part to the T-shaped gate design, the FETs described herein exhibit excellent microwave power gain with $f_{max}$ up to 10 GHz. It is believed that further improvement of both $f_T$ and $f_{max}$ of the graphene FETs can be achieved by using the T-gate transistor design with metal-graphene junction and transferred graphene quality improved.

Figure 12:
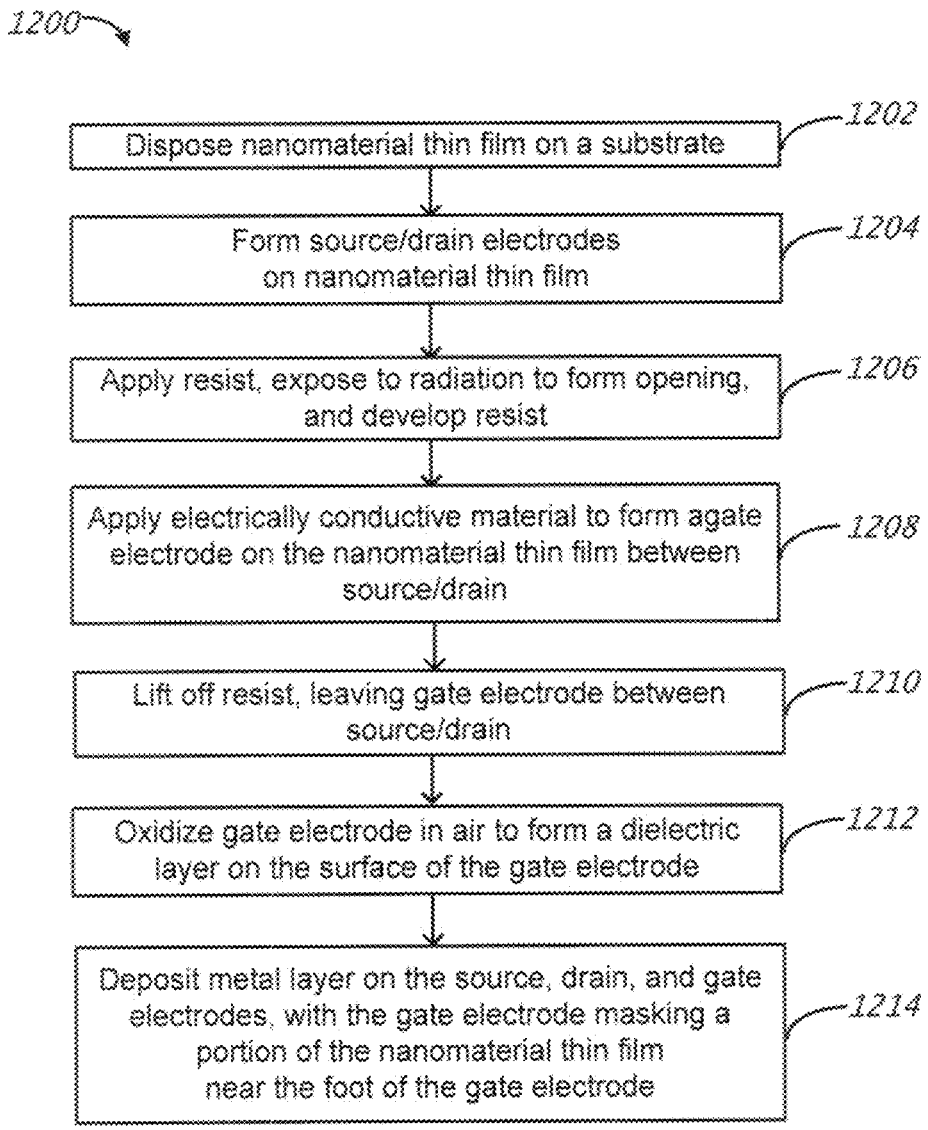
FIG. 12 is a flowchart describing a process for fabricating a self-aligned FET having a T-shaped gate electrode.

FIG. 12 is a flowchart describing process 1200 for fabricating a self-aligned FET having a T-shaped gate electrode. In 1202, a nanomaterial thin film is disposed on a substrate. The nanomaterial thin film may be prepared by methods generally known in the art, including methods described herein. In 1204, the source and drain electrodes are formed on the nanomaterial thin film, and nanomaterial thin film outside of the active area is removed from the substrate as described, for example, with respect to FIG. 1A. In 1206, a resist coating is formed, exposed to radiation, and developed as described, for example, with respect to FIGS. 1B-1C. In 1208, an electrically conductive layer is disposed on the remaining resist and on the exposed portion of the nanomaterial thin film, thereby forming a gate electrode as described, for example, with respect to FIG. 1D. In 1210, the resist is lifted off, and in 1212 the gate electrode is allowed to oxidize in air to form a dielectric coating as described, for example, with respect to FIG. 1E. In 1214, a metal layer is deposited on the source, drain, and gate electrodes, with the gate electrode masking a portion of the nanomaterial thin film near the foot of the gate electrode and the drain electrode as described, for example, with respect to FIG. 1F, thereby forming self-aligned source and drain electrodes. In some cases, portions of process 1200 may be omitted or performed in an order other than that described in FIG. 12. In certain cases, operations may be added to process 1200.

Advantages of the fabrication process described herein include device dimension scalability, in which gate length (and channel length, as described herein), determined by the length of the foot of the T-shaped gate electrode, can be scaled down below 20 nm with lithographic methods generally known in the art, yet can also be compatible with very large scale device width and integration. Another advantage is that the gate resistance can be readily reduced by increasing the cross-sectional area of the head of T-shaped gate electrode. This reduction in gate resistance allows for improvement in the power gain of high frequency (radiofrequency) FETs. Moreover, the described fabrication process offers a practical, cost-effective, and reliable method for large scale fabrication and integration of nanomaterials in FETs.

The fabrication method described herein is reliable, allowing for high-yield fabrication of large number of self-aligned FETs with T-shaped gate electrodes, and scalable, suitable for further scaling down of device dimensions. While the FETs described herein are analog RF transistors, such self-aligned T-gate fabrication can be combined with selected nanomaterials (e.g., patterned or assembled graphene nanoribbons) with a bandgap to produce high performance transistors with high on/off ratio for digital electronics. In addition, self-aligned FETs with T-shaped gate electrodes having configurations other than those described with respect to FIGS. 1A-1H and FIG. 5B may be fabricated by methods described herein.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method comprising:
   forming a source electrode and a drain electrode on a nanomaterial thin film, thereby defining a channel area between the source electrode and the drain electrode, wherein the nanomaterial thin film is disposed on a substrate;
   removing at least a portion of the nanomaterial thin film located outside of the channel area from the substrate;
   disposing resist over the source electrode, the drain electrode, and the nanomaterial thin film in the channel area;
   removing a portion of the resist between the source electrode and the drain electrode, thereby forming an opening in the resist between the source electrode and the drain electrode;
   developing the resist;
   applying an electrically conductive material over the developed resist, thereby forming a gate electrode in the opening, the gate electrode comprising a head region and a foot region, the foot region in contact with a first portion of the nanomaterial thin film in the channel area and having a length parallel to a surface of the nanomaterial thin film shorter than a maximum length of the head region parallel to the surface of the nanomaterial thin film;
   removing the developed resist;
   forming a dielectric layer on an outer surface of the gate electrode; and
   depositing a metal layer over the source electrode, the drain electrode, the head region of the gate electrode, and a second portion of the nanomaterial thin film in the channel area, wherein the head region of the gate electrode inhibits deposition of the metal layer over a third portion of the nanomaterial thin film proximate the foot region of the gate electrode.

2. The method of claim 1, wherein the opening in the resist is a T-shaped opening, and forming the gate electrode comprises forming a T-shaped gate electrode.

3. The method of claim 1, wherein forming the source electrode and the drain electrode on the nanomaterial thin film comprises depositing metal pads on the nanomaterial thin film.

4. The method of claim 1, wherein removing at least the portion of the nanomaterial thin film located outside of the channel area comprises etching the substrate.

5. The method of claim 1, wherein disposing resist over the source electrode, the drain electrode, and the nanomaterial thin film in the channel area comprises forming a bilayer resist mask.

6. The method of claim 1, wherein removing the portion of the resist between the source electrode and the drain electrode comprises exposing the portion of the resist to radiation.

7. The method of claim 6, wherein exposing the portion of the resist to radiation comprises exposing at least some of the portion of the resist to a first dose of radiation, and exposing the rest of the portion to a second dose of radiation, wherein the first dose of radiation is more energetic than the second dose of radiation.

8. The method of claim 1, wherein applying the electrically conductive material over the developed resist comprises forming a unitary gate electrode in the opening.

9. The method of claim 1, wherein forming the dielectric layer on the outer surface of the gate electrode comprises allowing the gate electrode to oxidize in air.

10. The method of claim 1, further comprising forming a dielectric layer between the foot region of the gate electrode and the third portion of the nanomaterial thin film proximate the foot region of the gate electrode.

11. The method of claim 1, wherein depositing the metal layer comprises depositing the metal layer from a direction normal to the surface of the nanomaterial thin film.

12. The method of claim 1, wherein depositing the metal layer over the source electrode, the drain electrode, the head region of the gate electrode, and the second portion of the nanomaterial thin film in the channel area comprises self-aligning the source electrode and the drain electrode.

13. The method of claim 1, further comprising disposing the nanomaterial thin film on the substrate before forming the source electrode and the drain electrode on the nanomaterial thin film.

14. A field-effect transistor formed by the method of claim 1.

15. A device comprising the field-effect transistor formed by the method of claim 1.

16. A field-effect transistor comprising:
a substrate;
a nanomaterial thin film disposed on the substrate;
a source electrode and a drain electrode formed on the nanomaterial thin film,
a channel area defined between the source electrode and the drain electrode;
a gate electrode extending from the nanomaterial thin film in the channel area between the source electrode and the drain electrode, the gate electrode having an outer dielectric layer and comprising a foot region and a head region, the foot region in contact with a portion of the nanomaterial thin film in the channel area and having a length parallel to a surface of the nanomaterial thin film shorter than a maximum length of the head region parallel to the surface of the nanomaterial thin film;
a metal layer disposed over the source electrode, the drain electrode, the head region of the gate electrode, and portions of the nanomaterial thin film proximate the source electrode and the drain electrode in the channel area, wherein the portions of the nanomaterial thin film proximate the source electrode and the drain electrode in the channel area are defined by a projection of the head region of the gate electrode onto the nanomaterial thin film in the channel area.

17. The field-effect transistor of claim 16, wherein the nanomaterial thin film comprises conducting nanomaterials, semiconducting nanomaterials, or a combination thereof 18. The field-effect transistor of claim 16, wherein the nanomaterial thin film comprises nanomaterials selected from the group consisting of carbon nanotubes, graphene, graphene nanoribbons, and nanowires.

19. The field-effect transistor of claim 16, wherein the gate electrode is a unitary structure.

20. The field-effect transistor of claim 16, wherein the gate electrode is T-shaped.

21. The field-effect transistor of claim 16, wherein a channel length of the field-effect transistor is between 100 and 200 nm.

22. The field-effect transistor of claim 16, wherein the gate electrode comprises aluminum, and the outer dielectric layer comprises an oxide of aluminum.

23. The field-effect transistor of claim 16, gate electrode is self-aligned.

24. The field-effect transistor of claim 16, wherein a current-gain cut-off frequency ($f_T$) of the field-effect transistor is in a range between 5 GHz and 25 GHz.

25. A device comprising the field-effect transistor of claim 16.

* * * * *